US010210962B2

(12) United States Patent
Harada et al.

(10) Patent No.: US 10,210,962 B2
(45) Date of Patent: Feb. 19, 2019

(54) CHARGED PARTICLE BEAM DEVICE, OPTICAL DEVICE, IRRADIATION METHOD, DIFFRACTION GRATING SYSTEM, AND DIFFRACTION GRATING

(71) Applicant: HITACHI, LTD., Chiyoda-ku, Tokyo (JP)

(72) Inventors: Ken Harada, Tokyo (JP); Teruo Kohashi, Tokyo (JP); Tomohiro Iwane, Tokyo (JP)

(73) Assignee: HITACHI , LTD., Tokyo (JP)

( * ) Notice: Subject to any disclaimer, the term of this patent is extended or adjusted under 35 U.S.C. 154(b) by 117 days.

(21) Appl. No.: 15/117,075

(22) PCT Filed: Feb. 5, 2014

(86) PCT No.: PCT/JP2014/052608
§ 371 (c)(1),
(2) Date: Aug. 5, 2016

(87) PCT Pub. No.: WO2015/118624
PCT Pub. Date: Aug. 13, 2015

(65) Prior Publication Data
US 2017/0194065 A1   Jul. 6, 2017

(51) Int. Cl.
*G21K 1/06* (2006.01)
*H01J 37/04* (2006.01)
(Continued)

(52) U.S. Cl.
CPC .............. *G21K 1/06* (2013.01); *G02B 5/1842* (2013.01); *G02B 5/1866* (2013.01); *H01J 37/04* (2013.01);
(Continued)

(58) Field of Classification Search
CPC .. H01J 37/00; H01J 37/02; H01J 37/07; H01J 37/26; H01J 37/295; G21K 1/06; G02F 1/133502
(Continued)

(56) References Cited

U.S. PATENT DOCUMENTS

| 2005/0194533 A1* | 9/2005 | Okuda | H01J 37/21 250/307 |
| 2010/0051806 A1* | 3/2010 | Sasaki | H01J 37/153 250/310 |
| 2012/0153144 A1* | 6/2012 | McMorran | H01J 37/28 250/307 |

OTHER PUBLICATIONS

Verbeeck, J., et al.; "Production and application of electron vortex beams"; vol. 467; pp. 301-304; Sep. 16, 2010.

* cited by examiner

*Primary Examiner* — Jason McCormack
(74) *Attorney, Agent, or Firm* — Miles & Stockbridge P.C.

(57) ABSTRACT

The outer shape and size of a diffraction grating including an edge dislocation is made smaller than the irradiation areas of light waves and electromagnetic waves, by using an opener different from in the diffraction grating, the shape and size of the opening is superposed on the shape of a spiral wave that is generated by an edge dislocation diffraction grating, and the shape and size of the opening are reflected in the shape and size of the spiral wave on the diffractive surface. In addition, not only a diffraction grating system including a pair of a single opener and a single diffraction grating, but also a diffraction grating system in which plural openers and plural edge dislocation diffraction gratings are combined are used, and plural spiral waves can be generated on the diffractive surface with a higher degree of freedom.

10 Claims, 24 Drawing Sheets

(51) Int. Cl.
*H01J 37/09* (2006.01)
*H01J 37/26* (2006.01)
*G02B 5/18* (2006.01)

(52) U.S. Cl.
CPC .............. *H01J 37/09* (2013.01); *H01J 37/26* (2013.01); *G02B 2005/1804* (2013.01); *G21K 2201/064* (2013.01); *G21K 2201/067* (2013.01)

(58) Field of Classification Search
USPC ....... 250/306, 307, 311, 396 R, 492.1, 492.3
See application file for complete search history.

[Fig. 1]
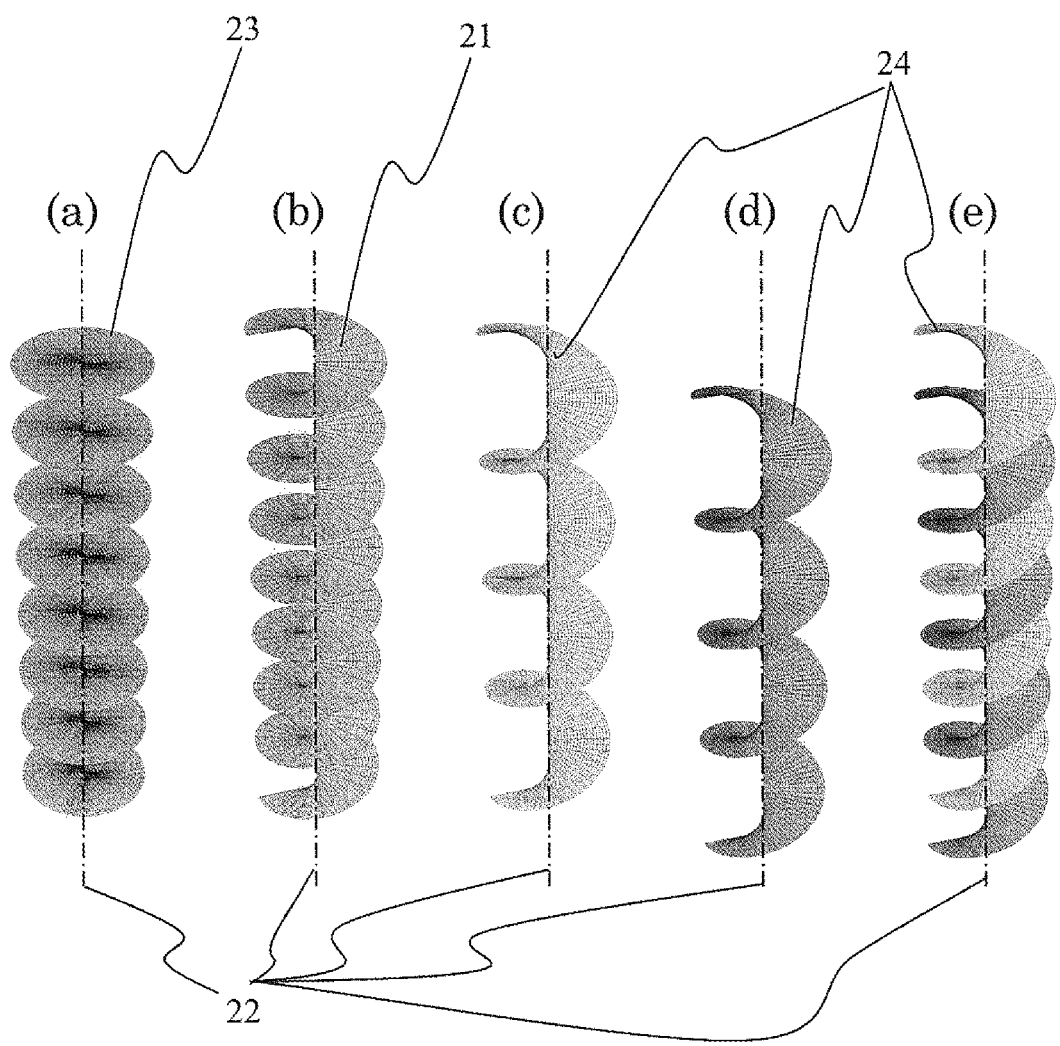

[Fig. 2A]
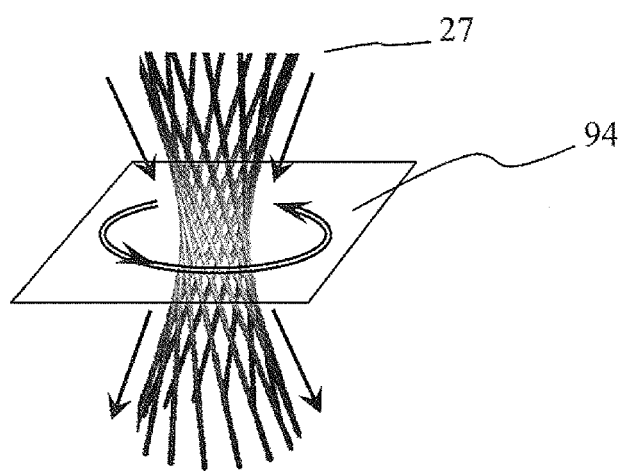
[Fig. 2B]
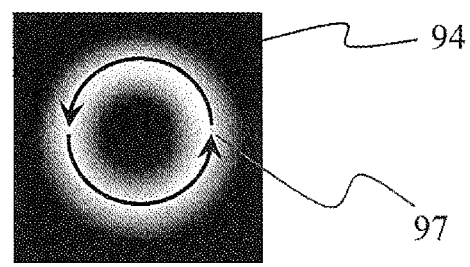

[Fig. 3]
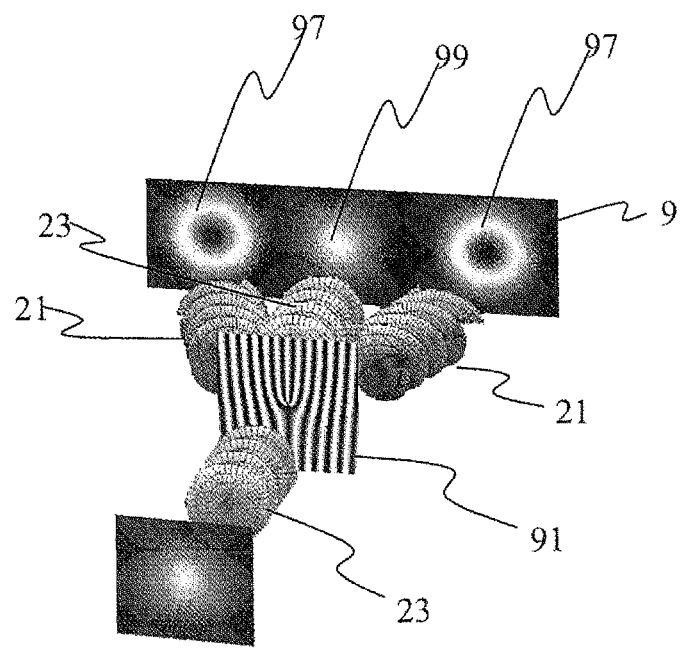

[Fig. 4A]
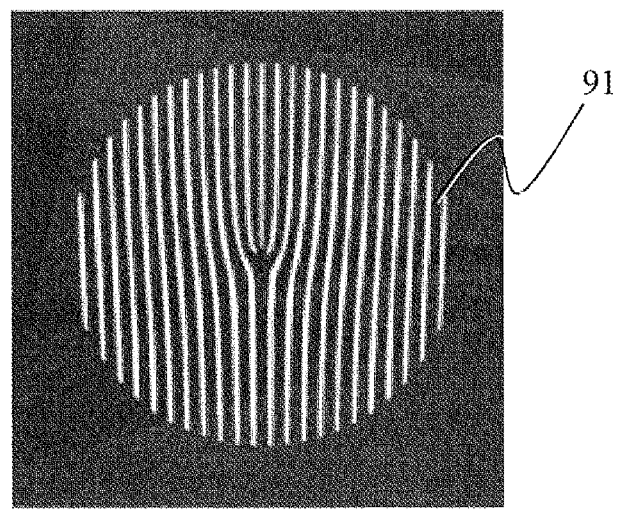
[Fig. 4B]
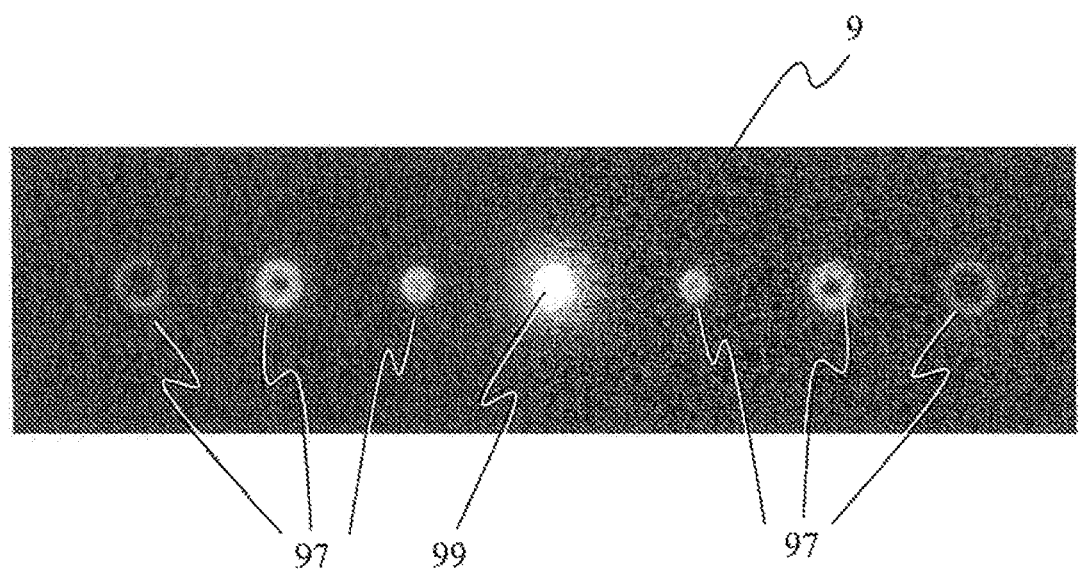

[Fig. 5]
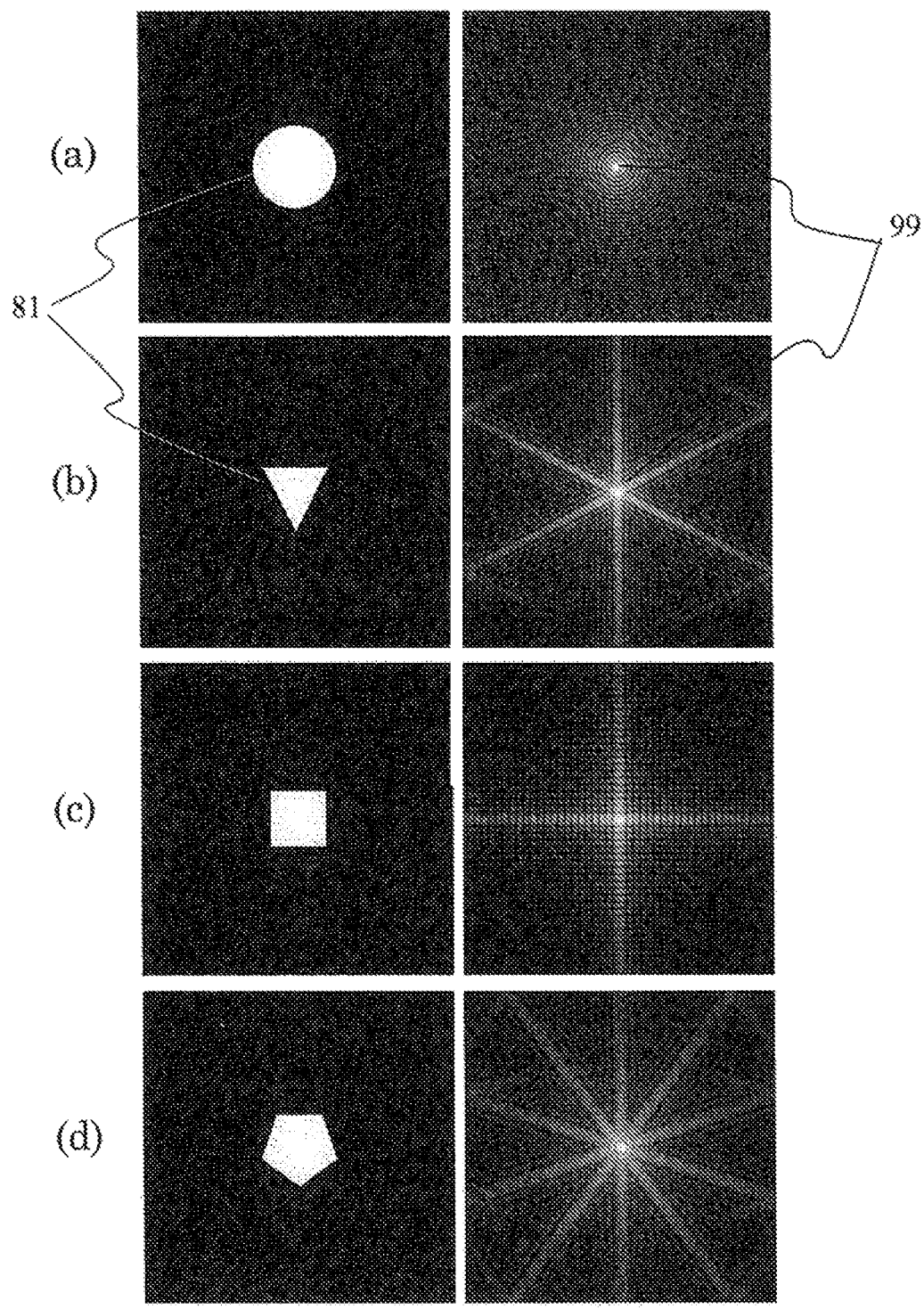

[Fig. 6]
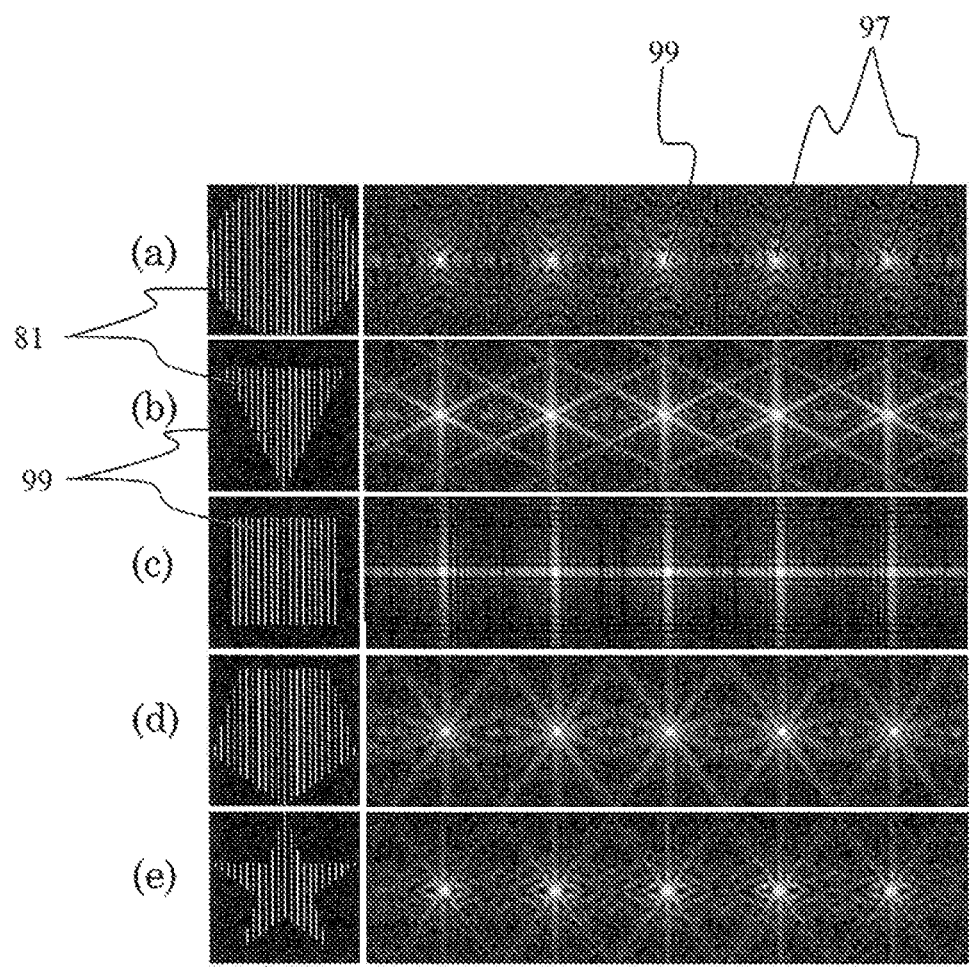

[Fig. 7]
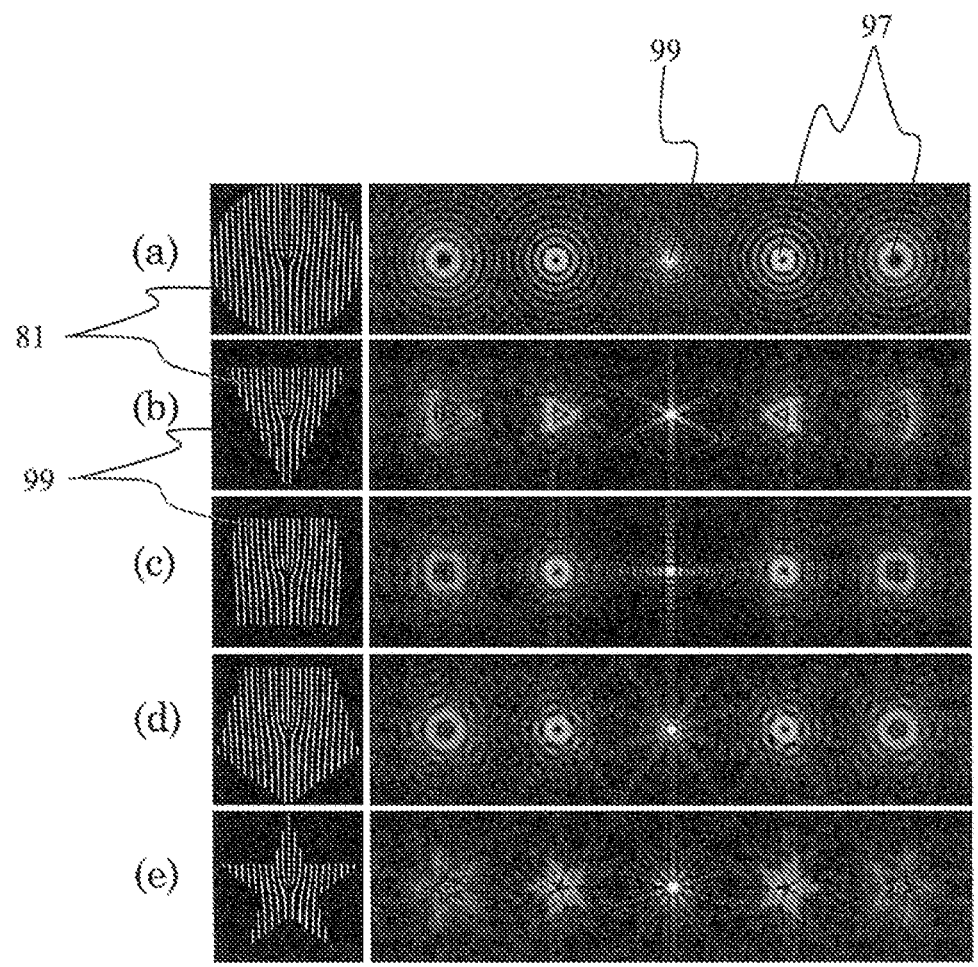

[Fig. 8]
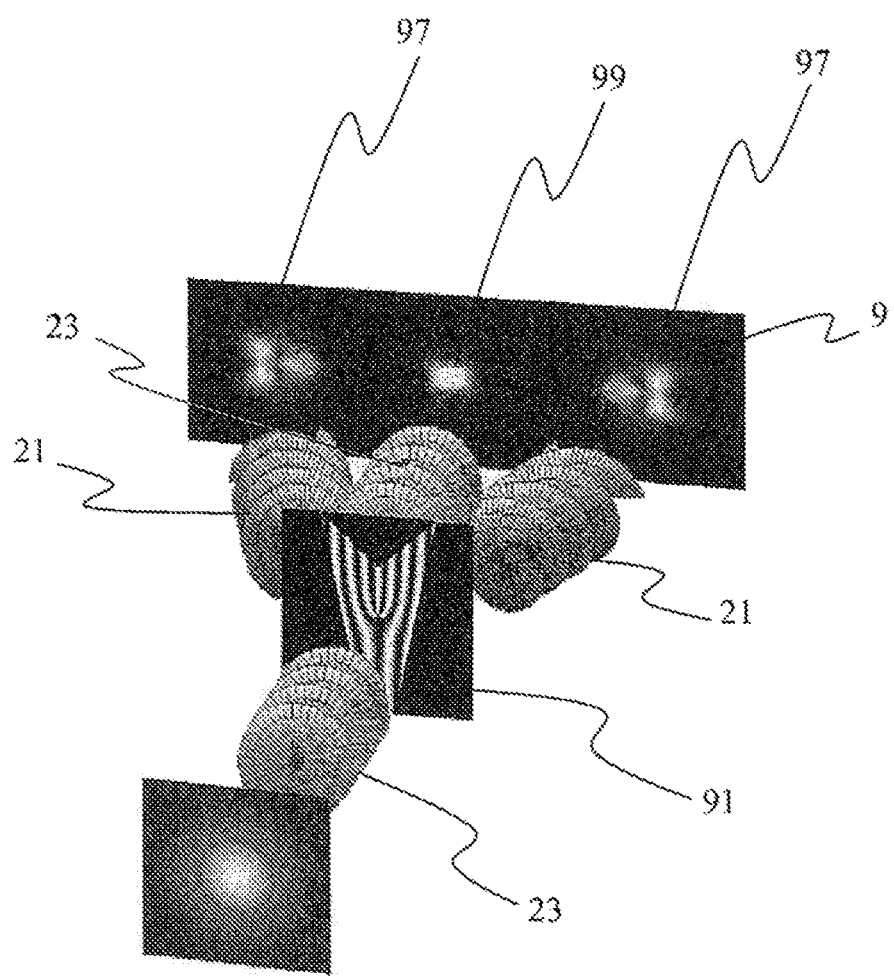

[Fig. 9A]
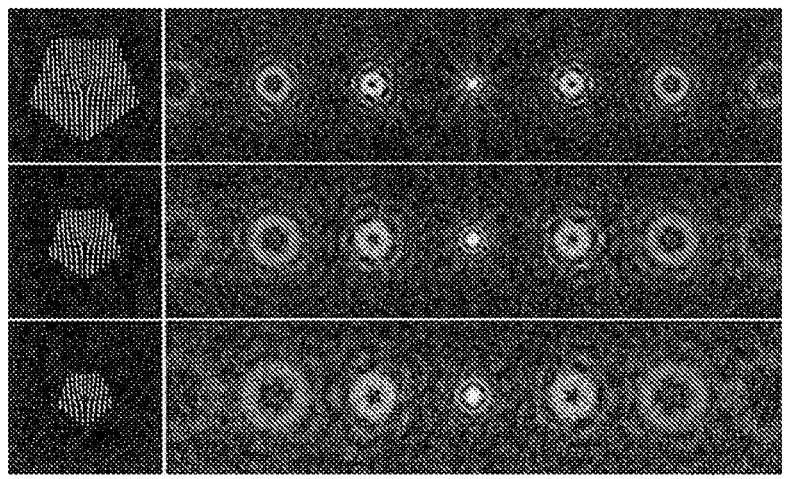
[Fig. 9B]
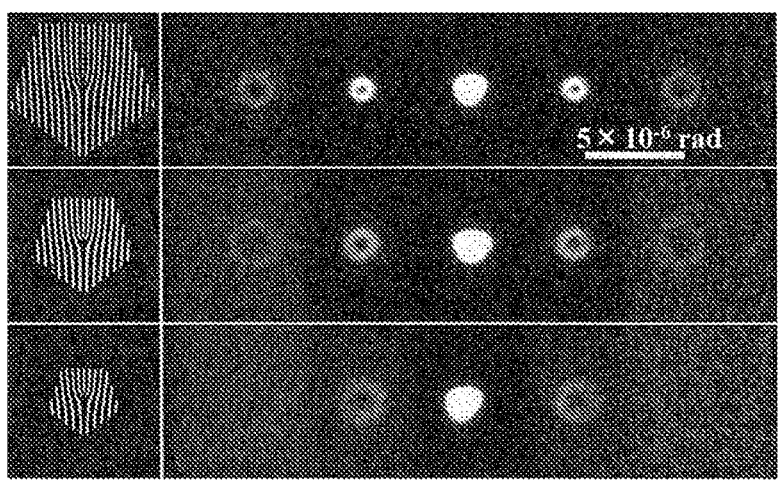

[Fig. 10]
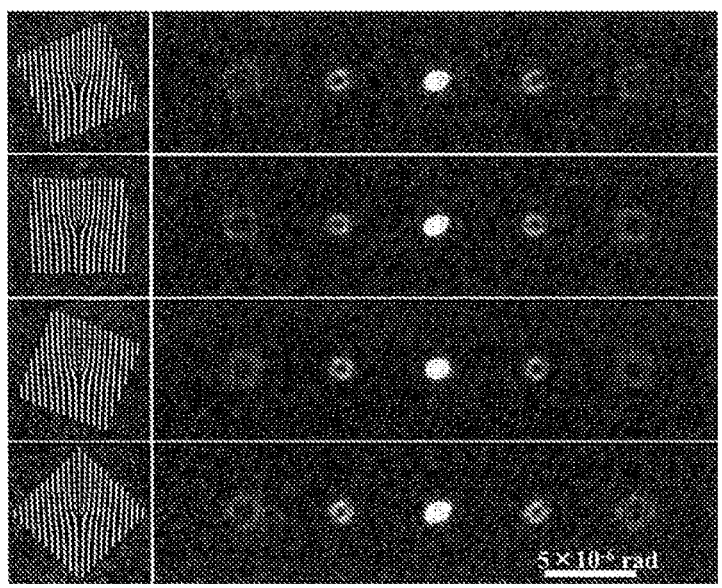

[Fig. 11A]
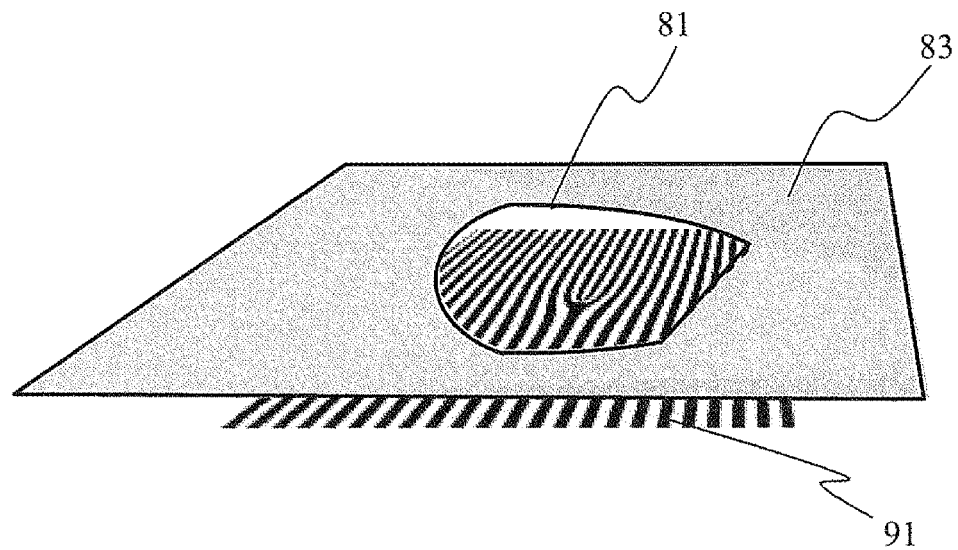
[Fig. 11B]
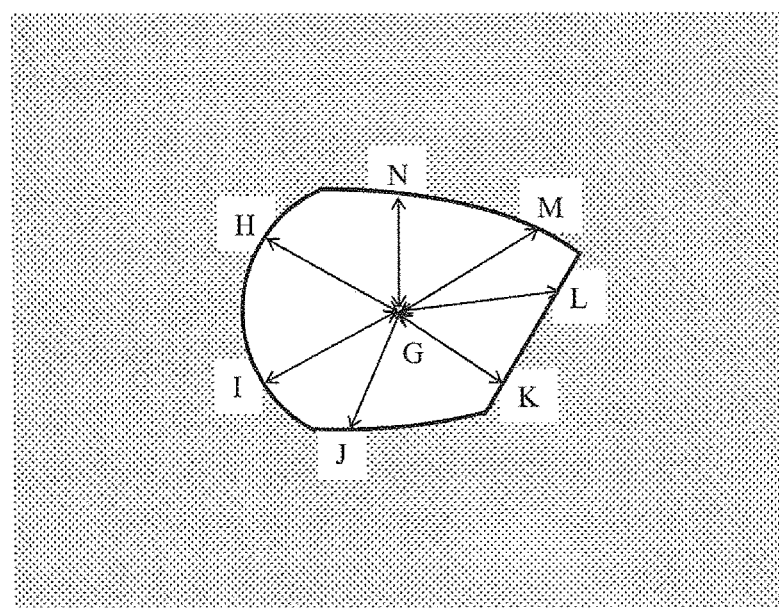

[Fig. 12]
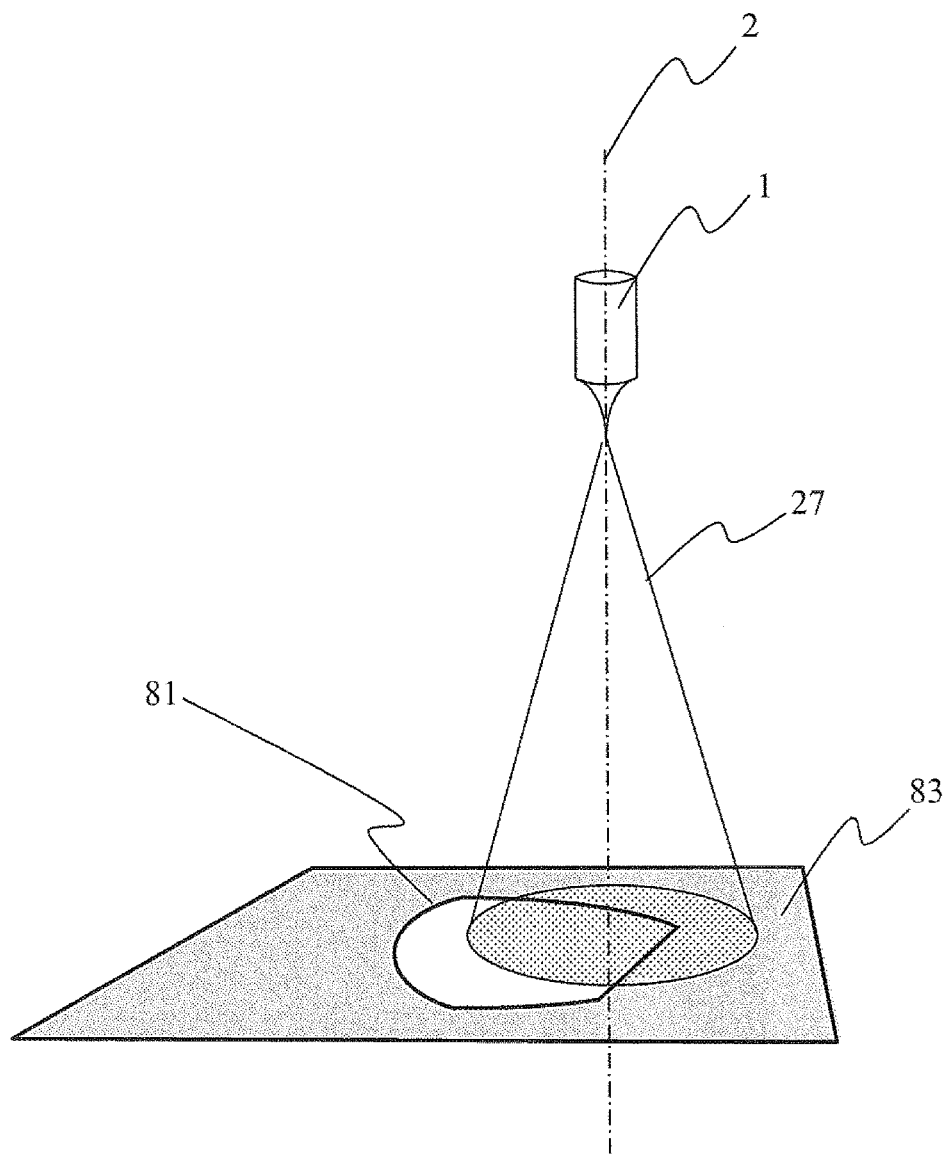

[Fig. 13]
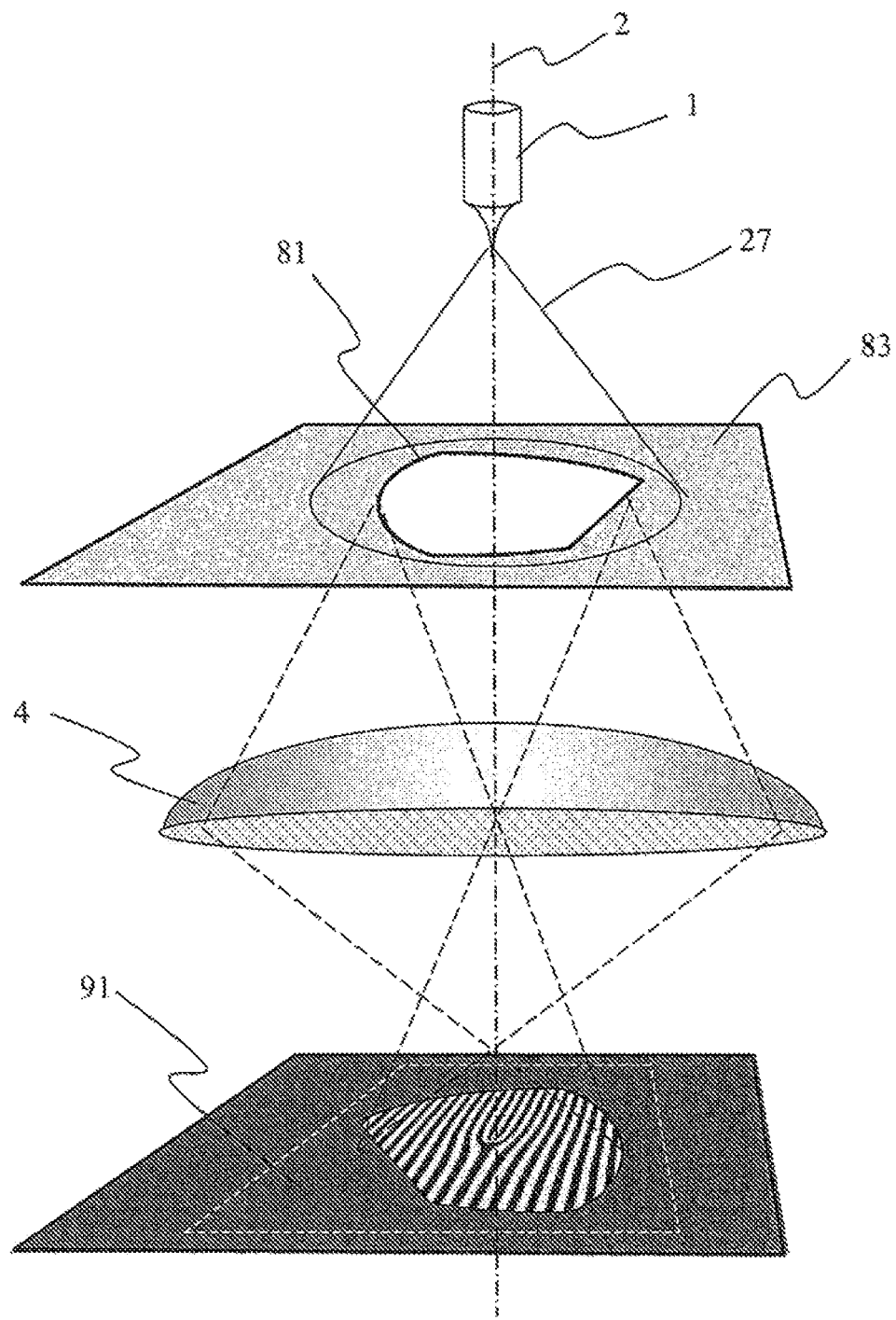

[Fig. 14A]
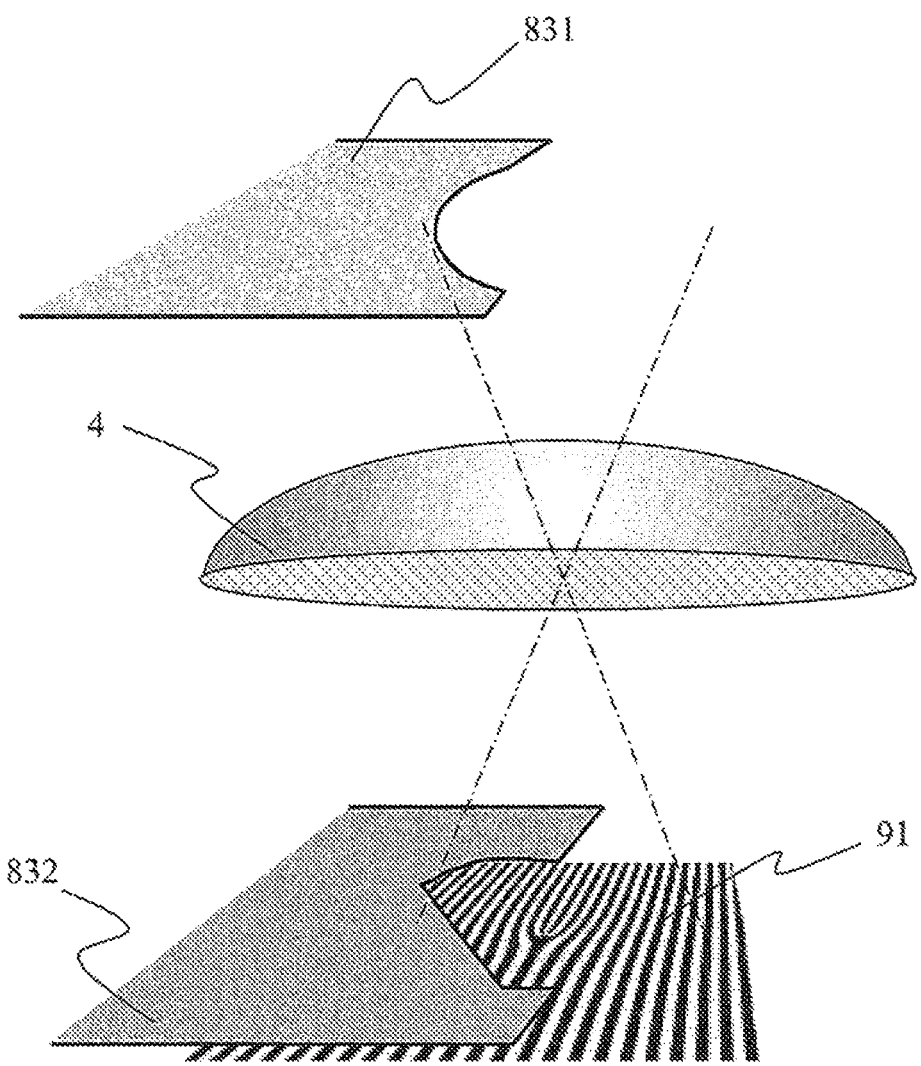
[Fig. 14B]
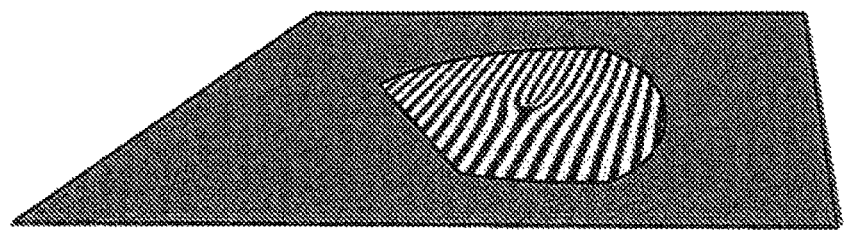

[Fig. 15]
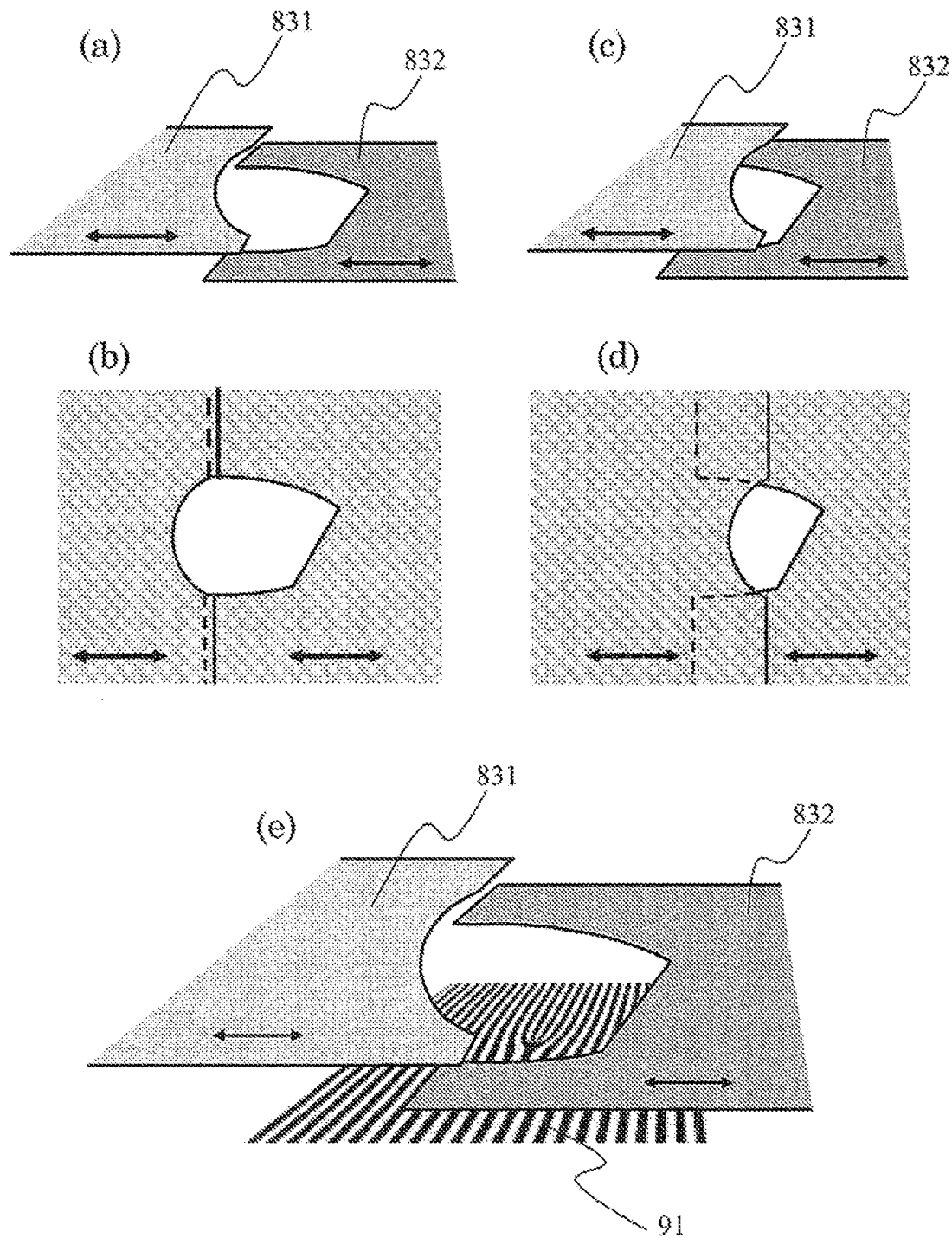

[Fig. 16A]
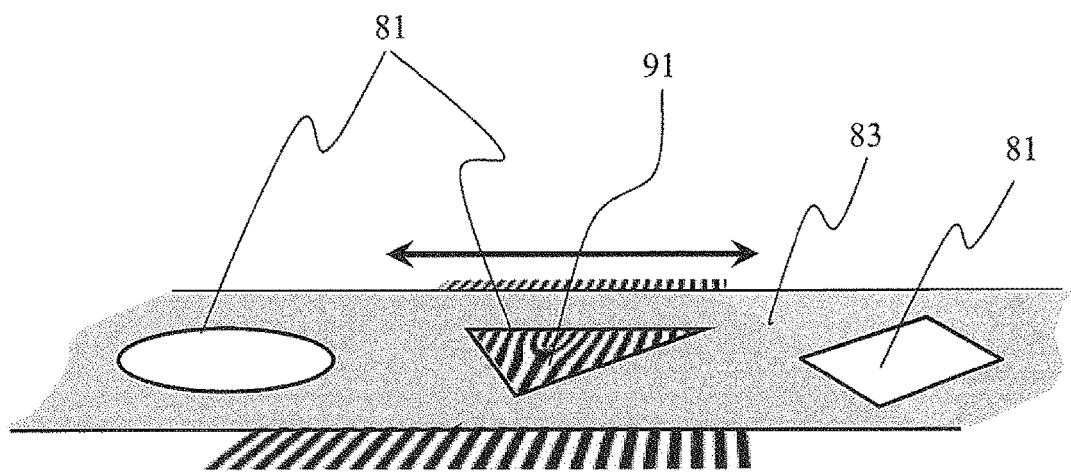
[Fig. 16B]
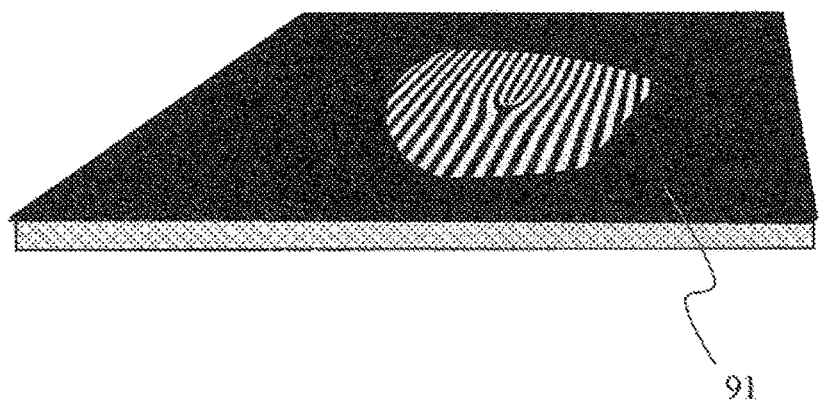

[Fig. 17]
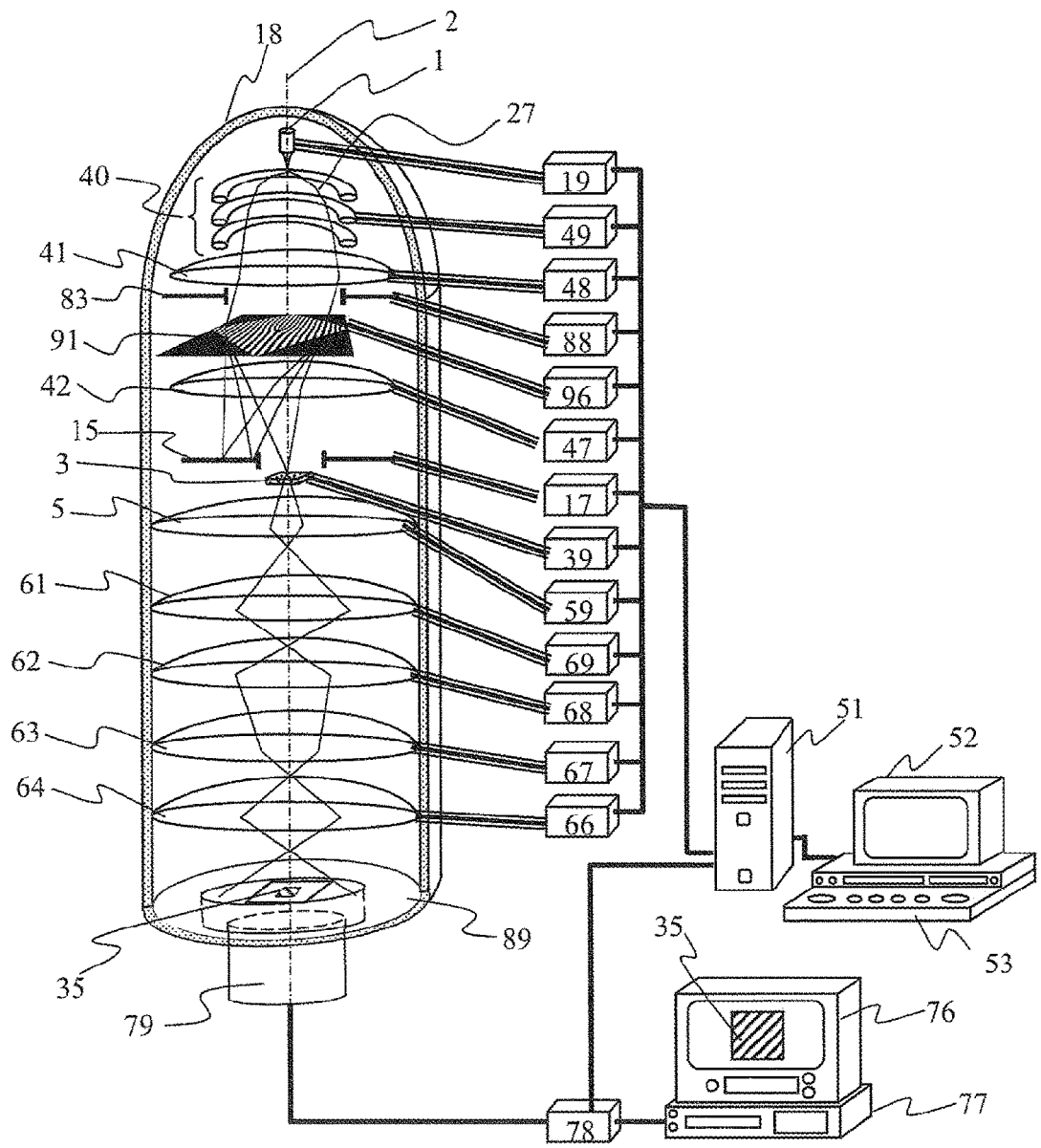

[Fig. 18]
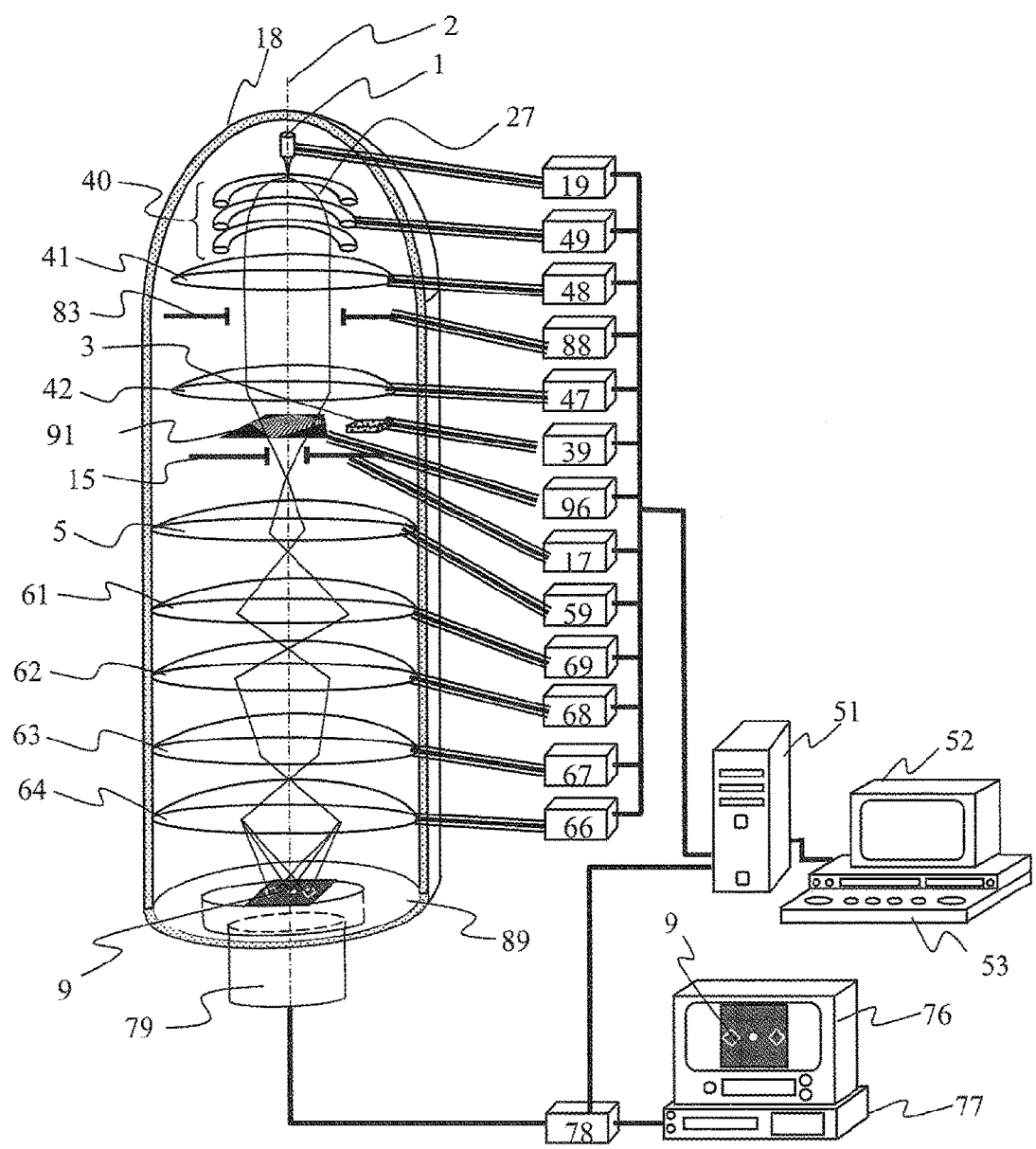

[Fig. 19]
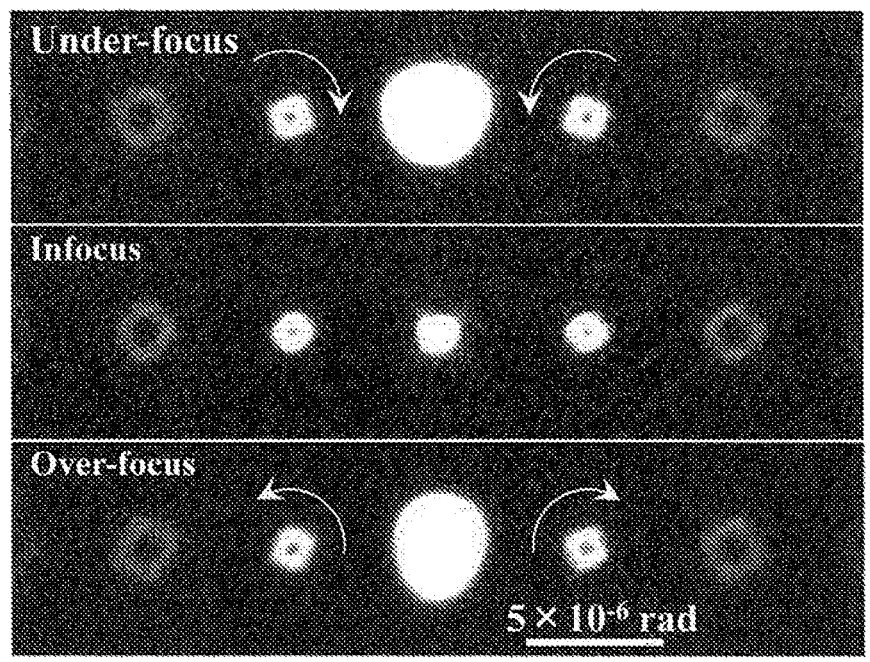

[Fig. 20]
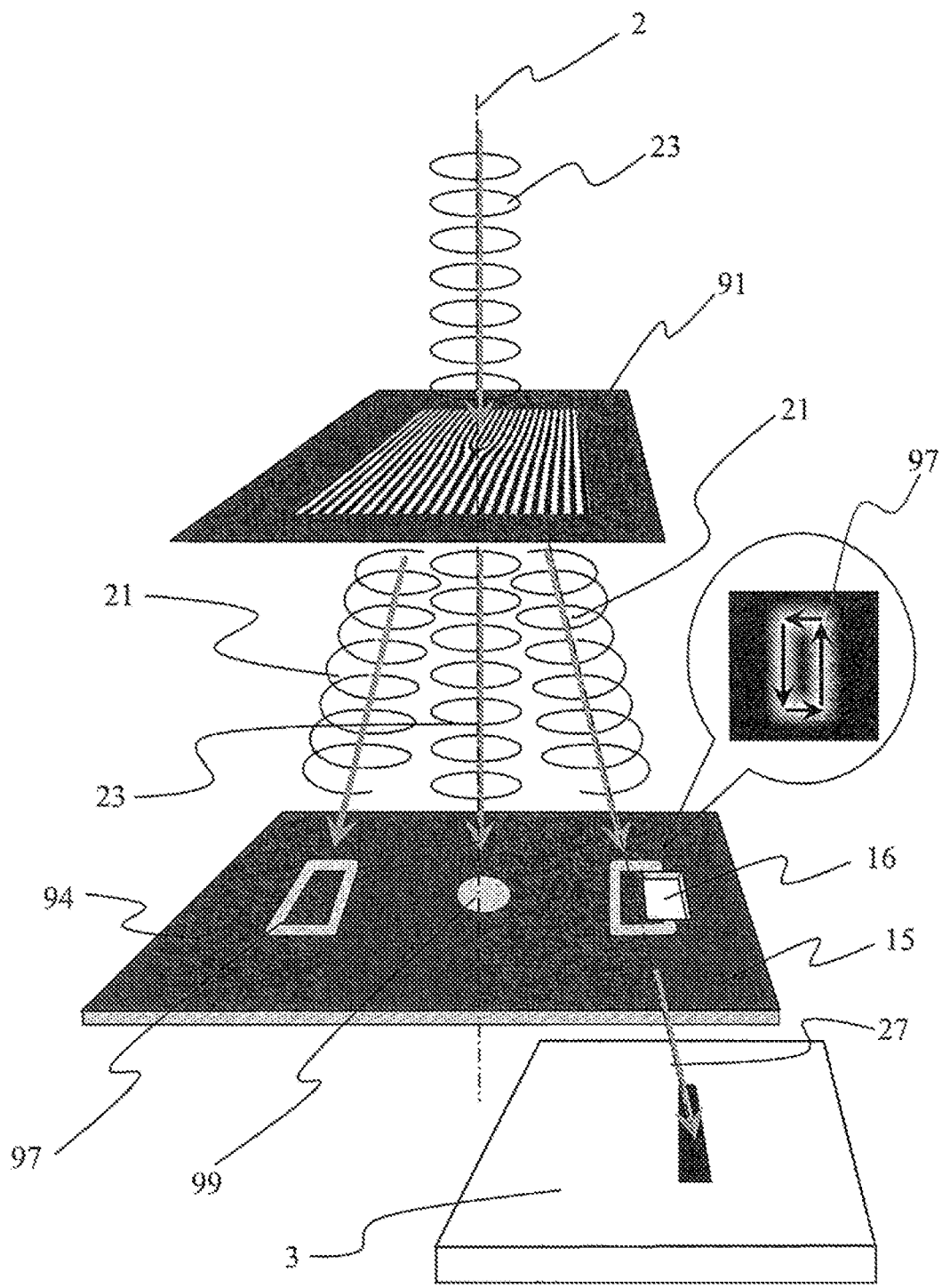

[Fig. 21]
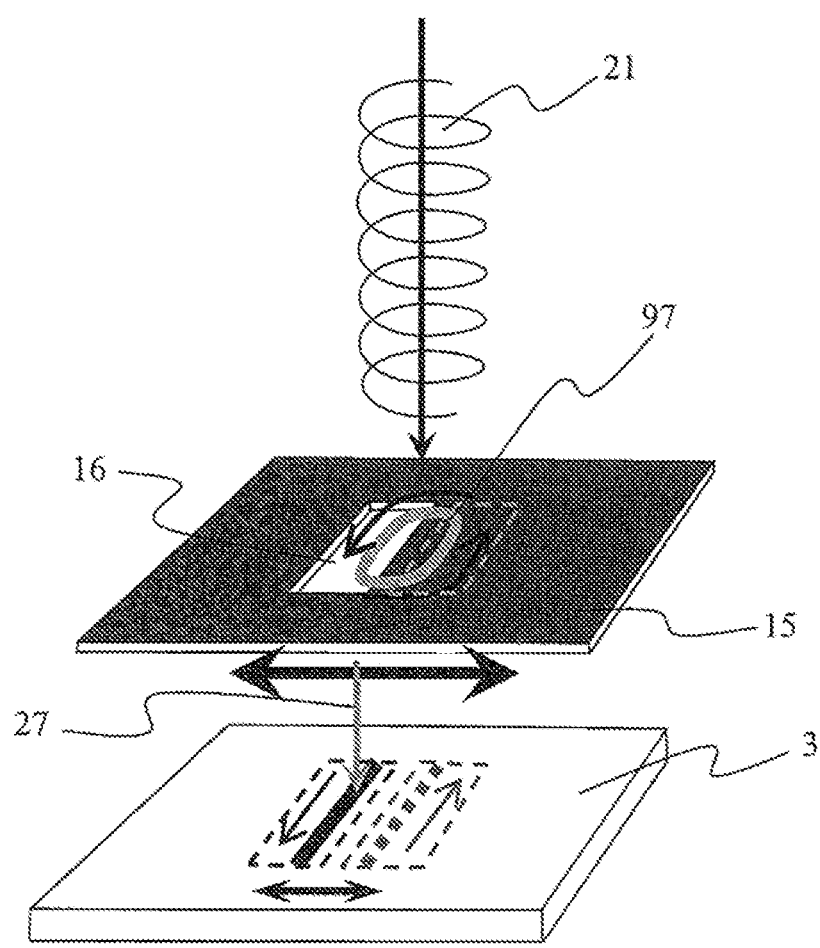

[Fig. 22]
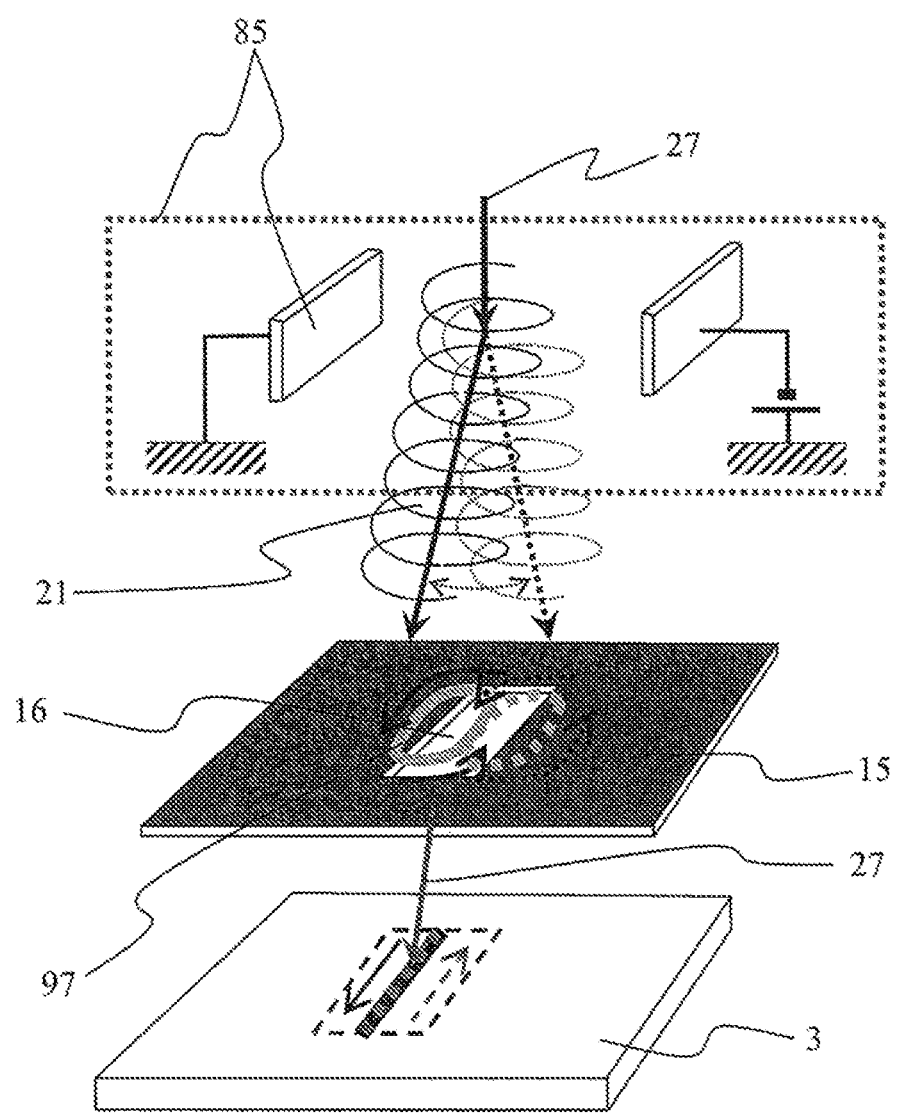

[Fig. 23A]
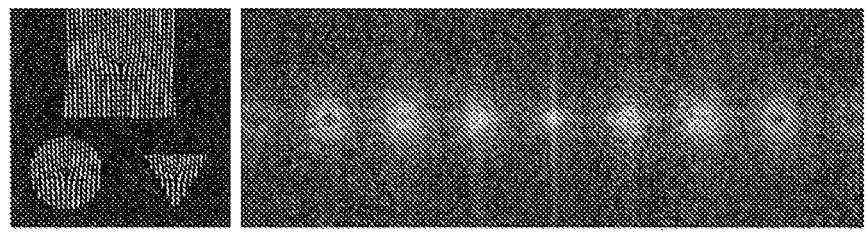
[Fig. 23B]
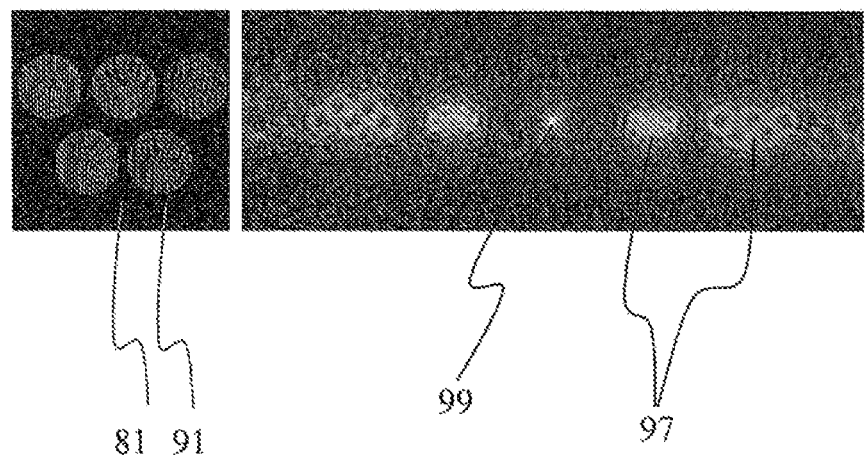

[Fig. 24]
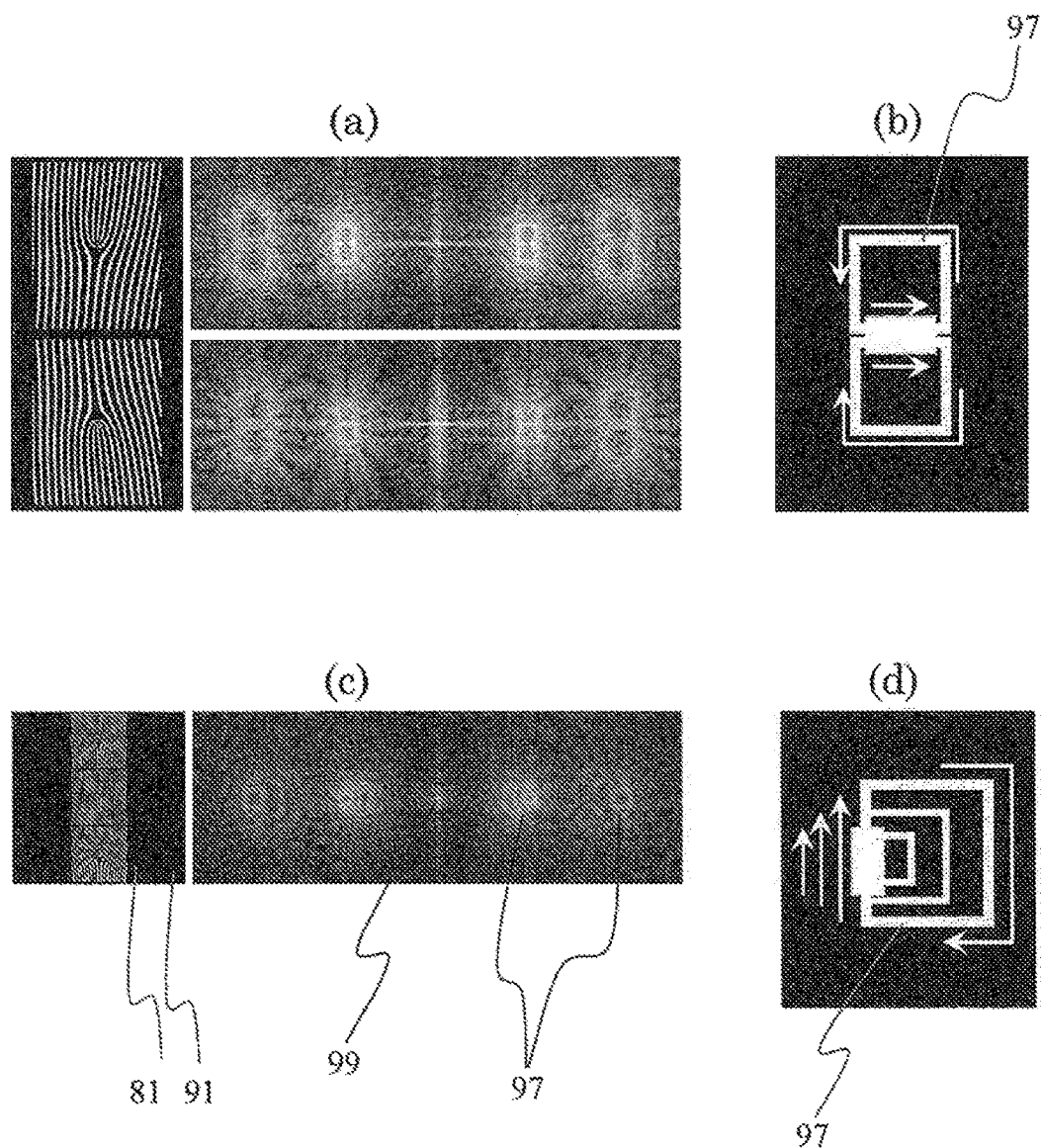

CHARGED PARTICLE BEAM DEVICE, OPTICAL DEVICE, IRRADIATION METHOD, DIFFRACTION GRATING SYSTEM, AND DIFFRACTION GRATING

TECHNICAL FIELD

The present invention relates to light beams including X-rays, charged particle beams such as electron beams, neutron beams, and ion beams, or uncharged particle beams. The present invention relates to a fork-type diffraction grating that generates spiral waves of which an equiphase surface forms a spiral shape, a diffraction grating including an opener that defines the outer shape of the grating, a diffraction grating system, an optical apparatus or a particle beam apparatus with the diffraction grating system, and a diffraction method using them.

BACKGROUND ART

<1. Spiral Wave>

Spiral waves which are the premise of the present application will be described, with light waves as an example. In a coherent optical system, the phase of propagating light waves is uniquely determined. A plane having an equal phase is called a wavefront, and waves are classified into plane waves (see FIG. 1a) or spherical waves depending on the shape of the wavefront.

On the other hand, there is a case of having a singularity in which the phase is not uniquely determined. The example thereof is a spiral wave in which an equiphase surface forms a spiral shape around a certain axis (generally, it is parallel to an optical axis). The spiral wave is a wave having a phase state in which the phase is changed by an integral multiple of $2\pi$ when the azimuth is rotated one round, with the singularity as a center (the axis of the spiral), when viewed respectively from a plane perpendicular to the propagation direction of the wave. The change amount of the phase of an integral multiple of $2\pi$ corresponds to an integral multiple of change in wavelength in the propagating light waves.

A spiral wave 21 of which a phase changes by $2\pi$ when the azimuth is rotated one round is illustrated in FIG. 1b. In the present application, the wave in a state of changing by $2\pi$ is referred to as a spiral wave of "helicity 1". As is apparent from FIG. 1b, the on-axis of the helical axis 22 becomes a singularity of a phase and it is not possible to determine the phase in the on-axis.

A spiral wave 24 of "helicity 2" of which phase changes by $4\pi$ when the azimuth is rotated one round is illustrated in FIG. 1c. The wavefront changes by two wavelengths when the azimuth is rotated one round considering propagating light waves. Since there is no possibility that the wavelength is extended, considering a wavefront which is shifted by exactly a half-period as illustrated in FIG. 1d, the phase distribution illustrated in FIG. 1e obtained by combining both wavefronts is considered as a model of a spiral wave of helicity 2. Similar to the case of helicity 1, the spiral wave has a singularity (helical axis 22) at which the phase is not uniquely determined. In other helicities, a combination of plural wavefronts is considered by matching the helicities, similar to FIG. 1e.

FIG. 2A is a diagram of a particle model depicting converging spiral waves as flow lines 27. Briefly, considering the flow lines as a particle track, it may be considered that the track (flow lines) is drawn in the direction perpendicular to the wavefront. As the helicity increases, the degree of twisting increases.

In FIG. 2B, an intensity distribution of the wave in a convergence surface (diffractive surface 94) is depicted, and the spiral wave becomes a ring-shaped spot 97 at the convergence point. This ring shape is expressed in a Bessel function (cylinder function). As illustrated in FIG. 2A, the converging spiral waves (particles) propagate while twisted, thereby transmitting momentum in a direction perpendicular to the propagation direction.

For example, in the case of placing a sample on the convergence surface 94 (the plane illustrated in FIG. 2B), it is possible to transmit the momentum in the direction of the plane to the sample. Thus, the feature of the spiral wave is capable of transmitting the momentum. In the example illustrated in FIG. 2B, the momentum of rotation is transmitted in a counterclockwise direction. In addition, the combined sum of the momentum in all directions becomes zero.

The spiral wave, which is referred to as Laguerre-Gaussian beam or optical vortex in optics, is a light wave propagating while maintaining the orbital angular momentum, and can exert force on an equiphase surface (wavefront). Therefore, it is possible to provide momentum to an irradiation target, and this is practically used as, for example, manipulation techniques such as optical tweezers which manipulate particles of a size of about a cell, laser processing, or super-resolution microspectroscopy. In addition, since multiple orbital angular momentums can be inherent in a portion of the spiral axis which is a phase singularity, this attracts attention in the field of quantum information communication. In addition, new technological evolution is expected in physical property analysis and structural analysis, such as analysis of a stereoscopic image of a magnetization state or an atomic arrangement in X-rays.

In addition, a topological charge (being inherent of orbital angular momentum) referred to herein has an advantage in selecting the strength of spiral winding. Hereinafter, for the sake of simplicity, the topological charge is also referred to as "helicity".

As described above, in the case of the spiral wave in electron beams (electron spiral wave), the electron beams propagate while maintaining the orbital angular momentum, such that it is expected to produce applications as an electron beam probe (incident beam) which is not present as of now. The examples of the application are of a highly sensitive or three-dimensional state measurement in magnetization measurements, and observation of high-contrast and high-resolution protein molecules or sugar chains. Especially, in the magnetization observation, the electron beam has a fundamental disadvantage with no sensitivity for parallel magnetization to the direction of propagation, but there is a possibility of observing the magnetization of the electron beam in a propagation direction in the electron spiral wave.

Moreover, there is a possibility of application not only to the observation, but also to processing and magnetization control using the orbital angular momentum. Therefore, it has started to receive attention as a probe of an electron beam apparatus of the next generation, along with the spin-polarized electron beam. In other words, regardless of a wave field and particles, there is a possibility as a new probe, and application and development are also contemplated with respect to X-rays, neutron beams, and ion beams, in addition to light waves and electron beams which are described herein.

<2. Generation of Spiral Wave>

Two types of methods are implemented to generate a spiral wave. One of them is a method of using that a thin film having a spiral shape (thickness distribution) is irradiated with a plane wave, and the phase distribution of the transmitted wave becomes a spiral shape due to the thickness of the film. The other thereof is a method of using a diffraction wave by the diffraction grating including edge dislocation called a fork-type grating (edge dislocation diffraction grating) (FIG. 3, and Non-Patent Document 1). In the first method of irradiating the thin film with a plane wave, in a case where the wavelength is extremely short such as electron waves, it is difficult to produce a thin film with a spiral shape, such that a second method of using an edge dislocation diffraction grating becomes popular at present.

Next, a description will be given on the second method of using a diffraction grating including the edge dislocation (edge dislocation diffraction grating) with reference to FIG. 3. The spiral wave 21 (a wave of which the equiphase surface forms a spiral shape) which is generated as a diffraction wave from an edge dislocation diffraction grating 91 forms ring-shaped diffraction spots 97, instead of a common point-shaped diffraction spot 99, in the diffraction image 9. If it is possible to spatially separate one of the ring-shaped diffraction spots in the diffractive surface 94, it is possible to retrieve a desired spiral wave 21. The generation of the spiral wave can control the degree of the helicity depending on the number of orders of the edge dislocations. In addition, it is possible to control the positive and negative (the right-handedness or left-handedness of the spiral) of the helicity by the positive and negative of the Burgers vector of the edge dislocations.

FIG. 4A is an electron microscope image of a third-order edge dislocation grating 91 which is actually produced. The edge dislocation grating 91 is produced by performing processing on a silicon nitride membrane (thickness 200 nm) by a focusing ion beam apparatus. Three gratings are inserted from the upper side of FIG. 4A, and are concentrated in the central portion. In other words, the concentrated portion is located in a position of the core of the edge dislocations, and the order of FIG. 4A is a third order. The order of the edge dislocation and the degree of the generated spiral wave basically match. However, in a case where the contrast of the diffraction grating is high and high-order diffraction waves are obtained, spiral waves are also generated which has the helicity of a product value which is obtained by multiplying the order of the edge dislocation and the order of the diffraction wave.

FIG. 4B is a small angle electron diffraction image 9 (recorded in a camera length of 150 m) which is obtained when a diffraction grating of FIG. 4A is irradiated with an electron beam of an acceleration voltage 300 kV. The ring-shaped diffraction spots 97 of ±1 orders, ±2 orders, and ±3 orders are observed on the left and right of the zero-order spot 99 of the central portion, and the ring diameter increases as the diffraction order increases. Thus, it can be seen that spiral waves having the helicities of ±3 orders, ±6 orders, and ±9 orders are generated. In other words, the ring diameter of the diffraction spot represents the helicity of the spiral wave directly. Thus, it is possible to generate plural types of spiral waves 21 from the diffraction grating 91, which includes one edge dislocation.

CITATION LIST

Non-Patent Literature

NPL 1: J. Verbeeck et al., Nature, 467 (2010) 301.

SUMMARY OF INVENTION

Technical Problem

Spiral waves can transmit momentum in a rotational direction to a probe which is effective in the high-contrast observation of polymer material, magnetic material, or the like that forms a ring or a ring-shaped irradiation area of the spiral waves. By utilizing this, for example, a probe that gives power to the gear of the irradiated object, such as a micro-machine (MEMS) has been considered, but only a circular illumination probe is generated. Therefore, the present inventors have found a problem that the efficiency of transmission is not good for general material and an irradiated sample. Then, more effectively, spiral waves of a certain shape, spiral waves capable of transmitting momentum in a certain direction, and an apparatus and a method capable of controlling the spiral waves are invented by generating an illumination probe of a shape other than the circular illumination probe.

Solution to Problem

In order to solve the above problems, a charged particle beam apparatus according to the present application includes a diffraction grating including an edge dislocation on a grating plane; and a control unit that irradiates the diffraction grating with charged particle beams, the control unit irradiates the grating plane with only some of an irradiation area of the charged particle beam, and some of the irradiation area of the charged particle beam includes an edge dislocation of the diffraction grating.

As another aspect, the irradiation method according to the present application includes an irradiation step of irradiating a diffraction grating including an edge dislocation on a grating plane with charged particle beams; and a detection step of detecting the charged particle beam passing through the diffraction grating, the irradiation step is a step of irradiating the grating plane with only some of an irradiation area of the charged particle beam, and some of the irradiation area of the charged particle beam includes an edge dislocation of the diffraction grating.

As still another aspect, the diffraction grating system according to the present application includes a diffraction grating including an edge dislocation on a grating plane; and an opener in which the outer shape of an opening portion is enclosed by a closed curve, and there are plural distances from the centroid point of the shape of the closed curve to a certain point of the closed curve.

As still further another aspect, the irradiation method according to the present application includes an irradiation step of irradiating a diffraction grating including an edge dislocation on a grating plane with charged particle beams; an irradiation step of irradiating an opener in which an outer shape of an opening portion is enclosed by a closed curve, and there are plural distances from the centroid point of the shape of the closed curve to a certain point of the closed curve with the charged particle beam; and a detection step of detecting the charged particle beam passing through the opening portion and the diffraction grating.

As still further another aspect, the diffraction grating according to the present application is a diffraction grating having an edge dislocation on the grating plane, and in the diffraction grating, the outer shape of the grating plane is enclosed by a closed curve, there are plural distances from the centroid point of the shape of the closed curve to a certain point of the closed curve, and the outer shape of the grating plane is a shape of a triangle or an N polygon (N is 5 or more).

Further, as still further another aspect, the diffraction grating according to the present application is a diffraction grating having an edge dislocation on a grating plane, and in the diffraction grating, the outer shape of the grating plane is enclosed by a closed curve, there are plural distances from the centroid point of the shape of the closed curve to a certain point of the closed curve, and the outer shape of the grating plane is a shape having a curve.

Advantageous Effects of Invention

By using the present invention, it is possible to generate spiral waves of a certain shape, or spiral waves capable of transmitting momentum in a certain direction. Further, it is possible to provide an apparatus and a method using efficient observation, processing and energy transfer using the spiral waves.

BRIEF DESCRIPTION OF DRAWINGS

FIGS. 1a-1e are schematic diagrams illustrating examples of a wavefront, in other words,
1a illustrates a plane wave,
1b illustrates a spiral wave of helicity 1,
1c illustrates a spiral wave of helicity 2,
1d illustrates a spiral wave of helicity 2 which is shifted by a half-period from 1c, and
1e illustrates a spiral wave of helicity 2 obtained by combining 1c and 1d.

FIG. 2A is a schematic diagram illustrating a convergent spiral wave indicated by flow lines.

FIG. 2B is a schematic diagram illustrating an intensity distribution of a wave on a convergence surface.

FIG. 3 is schematic diagram illustrating a state where spiral waves are generated from a diffraction grating including a third-order edge dislocation.

FIG. 4A is an electron microscope image of a third-order edge dislocation grating.

FIG. 4B is a small angle electron diffraction image of the third-order edge dislocation grating.

In FIGS. 5a-5d, are various opening shapes and simulation results illustrating Fraunhofer diffraction images (Fourier-transformed images) thereof.

In FIGS. 6a-6e, are simple gratings with various opening shapes and simulation results illustrating Fourier transform images thereof.

In FIGS. 7a-7e, are third-order edge dislocation gratings with various opening shapes and simulation results illustrating Fourier transform images thereof.

FIG. 8 is a schematic diagram illustrating a state where spiral waves are generated from a diffraction grating including a third-order edge dislocation with an opening of an arrowhead shape.

FIG. 9A is third-order edge dislocation gratings with pentagonal openings of three different sizes, and simulation results illustrating Fourier transform images thereof.

FIG. 9B is electron microscope images of third-order edge dislocation gratings with pentagonal openings of three different sizes and experimental results of small angle electron diffraction images.

FIG. 10 is electron microscope images of third-order edge dislocation gratings with square openings of four different azimuths and experimental results of small angle electron diffraction images.

FIG. 11A is a schematic diagram illustrating an example in which an opener and a diffraction grating are adjacent to each other.

FIG. 11B is a schematic diagram illustrating a relationship between an opening shape and a centroid point of the shape.

FIG. 12 is a schematic diagram illustrating a state where the opener is irradiated with light beams or particle beams.

FIG. 13 is a schematic diagram illustrating a state where the opener and the edge dislocation grating are disposed on an equivalent plane on an optical system through a lens.

FIG. 14A is a schematic diagram illustrating a state where some structure of an opener, a remaining structure of the opener, and an edge dislocation grating are disposed on an equivalent plane on the optical system through a lens.

FIG. 14B is a schematic diagram illustrating a projection view of the opener and the edge dislocation grating.

In FIGS. 15a-15e, 15a is a schematic diagram illustrating a state where the opener is configured with two structures, and the opening shapes and sizes are varied depending on the relative positions of the respective structures. 15b is a schematic diagram illustrating a state where the opener including two structures and the edge dislocation grating are disposed adjacent to each other. 15c, the structures constituting the opener are drawn on the same plane. The configuration on the image plane of FIGS. 14A-14B may be considered, and as illustrated in FIG. 15e, the opener configured with two adjacent structures (831) and (832) may be considered. FIG. 15b and of FIG. 15d illustrate how the size and shape of the opening are changed according to the change in a relative position between the two structures constituting the opener.

FIG. 16A is a schematic diagram illustrating that an opener having plural openings is adjacent to the edge dislocations grating and the position thereof is moved.

FIG. 16B is a schematic diagram illustrating an example of a case where the opener and an edge dislocation grating form an integral structure.

FIG. 17 is a schematic diagram illustrating a first example of a transmission electron microscope equipped with a diffraction grating system.

FIG. 18 is a schematic diagram illustrating a second example of the transmission electron microscope equipped with the diffraction grating system.

FIG. 19 is small angle electron diffraction images that are taken by the third-order edge dislocation grating of a rhombus opening shape at different focuses (experimental results).

FIG. 20 is a schematic diagram illustrating a state where the momentum of the spiral wave of one direction is selected by a rectangular diaphragm aperture element.

FIG. 21 is a schematic diagram illustrating a state where the rectangular diaphragm aperture element is moved.

FIG. 22 is a schematic diagram illustrating a state where a spiral wave is deflected by a deflector above the rectangular diaphragm aperture element.

FIG. 23A is plural edge dislocation gratings with openings of different shapes and sizes and a simulation result illustrating a Fourier transform image thereof.

FIG. 23B is a simulation result illustrating an example in which a pattern is drawn on the diffraction image plane by plural edge dislocation gratings having different basic grating spacing and grating orientations.

FIGS. 24a-24d are a simulation result illustrating an example in which the momentum of the spiral wave is superposed on the diffraction image plane by plural edge dislocation gratings.

DESCRIPTION OF EMBODIMENTS

In the present invention, the irradiation area of light waves, electromagnetic waves, or the like is controlled by changing the outer shape (the opening) of the diffraction grating including the edge dislocation into a certain shape. This can be implemented by making the outer shape or size of the diffraction grating including the edge dislocation smaller than the irradiation area of light waves, electromagnetic waves, or the like by using a separate opener from the diffraction grating, superposing the shape and size of the opening on the shape of the spiral wave that is generated by the edge dislocation diffraction grating, and reflecting the shape and size of the opening in the outer shape and size of the spiral wave on the diffractive surface. The opener is implemented by an optical system, specifically, such as an aperture or a diaphragm aperture.

The opener may be a diffraction grating system in which not a single but also plural openers and plural edge dislocation diffraction gratings are combined. This allows generating plural spiral waves on the diffractive surface with a higher degree of freedom. Furthermore, a predetermined portion of an irradiated sample is irradiated with spiral waves having momentum of predetermined orientation, direction, and intensity, by selecting (for example, passing) a predetermined portion of the generated spiral wave, by using an optical apparatus such as a diaphragm aperture.

Thus, the diffraction grating system described above is capable of controlling the diffraction spot of the spiral wave generated on the diffractive surface so as to be a certain shape or size. Further, a diffraction grating system in which plural edge dislocation diffraction gratings described above are combined is able to draw different patterns on the diffractive surface by spiral waves. It is possible to transmit momentum of a certain direction or a certain intensity to the irradiated sample, by selecting a predetermined portion of the spiral waves forming the pattern and irradiating the sample with the selected portion.

Next, a description on drawings (FIGS. 5a-5d to FIGS. 6a-6e) will be given which are studied by the inventors of the present application when inventing the present application. In other words, FIGS. 5a-5d illustrate openings 81 having various shapes (the left diagrams) and the calculation results of Fraunhofer diffraction images (the right diagrams). From the top, FIG. 5a is a circle opening, FIG. 5b is a triangle (equilateral triangle) opening, FIG. 5c is a rectangle (square) opening, and FIG. 5d is a pentagon (regular pentagon) opening.

In general, when the opening that forms a certain shape is irradiated with a plane wave, and the interference of the wave that passes through the opening and the wave that is diffracted by the edge portion of the opening is observed, the diffraction pattern that is fully observed at a distance far from the opening is referred to as a Fraunhofer diffraction image. Further, a diffraction pattern at a distance close to the opening is referred to as a Fresnel image. The condition required for observing the Fraunhofer diffraction image is given as Equation (1), with a distance l from the opening, a size (diameter d) of the opening, and a wavelength λ of an radiating plane wave. Further, in general, the Fraunhofer diffraction image is obtained as a Fourier transformed image of the opening shape, as in the case of the diffraction grating.

$$l \gg \frac{d^2}{\lambda}$$ [Equation 1]

In FIGS. 5a-5d, although the opening shapes are reflected in the shapes of the respective Fraunhofer diffraction images on the right side, the diffraction image center portion 99 (referred to as main peak) is converged, and it is difficult to directly find the shape of opening from the shape of the main peak. However, it is possible to know the opening shape, from subsidiary maxima located around a main maximum and the direction of streaks that the subsidiary maxima make.

In view of these results, an optical system corresponding to a small angle diffraction optical system has to be realized in which the shape of the opening is converged to the center portion 99 of the Fraunhofer diffraction image, and the observation magnification of the diffraction image is increased, in other words, the camera length is increased to directly observe the shape. For this purpose, it is necessary to make a particular optical system in a particle beam apparatus such as a general optical apparatus and an electronic microscope.

Next, a description on FIGS. 6a-6e will be given. The left diagram of FIGS. 6a-6e illustrate a simple grating (a set of the opening 81 and the grating 91) with an opening of the same shape as in FIGS. 5a-5d, and the right diagram of FIGS. 6a-6e illustrate the calculation result of the Fraunhofer diffraction image (Fourier-transformed image). Respectively, FIG. 6a is a circle opening, FIG. 6b is a triangle (equilateral triangle) opening, FIG. 6c is a rectangle (square) opening, FIG. 6d is a pentagon (regular pentagon) opening, and FIG. 6e is a star-shaped opening. The respective diffraction images on the right side indicate diffraction spots corresponding to the spacing of the grating (a zero-order diffraction spot 99 corresponding to a transmitted wave in the central part, and ±first-order and ±second-order diffraction spots 97 on the respective left and right sides thereof). None of the spots are intended to directly reflect the opening shape, and as in FIGS. 5a-5d, it is possible to know the opening shape from the directions of the streaks.

The above result can be considered as the convolution result in the Fourier space of the diffraction grating and the opening shape. In other words, since the convolution in a real space is a product in a reverse space, the diffraction wave from the diffraction grating is localized at a spatial frequency portion (diffraction point) corresponding to the grating spacing of the diffraction grating. Since the result of the product of the delta function localization and the Fraunhofer diffraction pattern reflecting the opening shape becomes a delta function localization, a distribution as on the right side of FIGS. 6a-6e is obtained.

Next, a description on FIGS. 7a-7e will be given. If an edge dislocation is included in the diffraction grating, the Fraunhofer diffraction patterns of the opening shape (81) and the diffraction grating (91) are changed. The left diagrams of FIGS. 7a-7e illustrate respective grating images in the case of dislocation gratings each including the third-order edge dislocation. The right diagrams of FIGS. 7a-7e illustrate the calculation results (right diagrams) of the Fraunhofer diffraction image (Fourier-transformed image). The grating spacing of the basic grating in the left diagrams of FIGS. 7a-7e is the same as the grating spacing of the simple grating of FIGS. 6a-6e, and the same condition as those of FIGS. 6a-e are used for the opening shape and size. As in FIGS. 6a-6e, respectively from the top, 6a is a circle opening, 6b is a triangle (equilateral triangle) opening, 6c is a rectangle (square) opening, 6d is a pentagon (regular pentagon) opening, and 6e is a star-shaped opening.

In the case of the edge dislocation grating, the edge dislocation included in the diffraction grating is a third order, the ± first-order diffraction spots of the diffraction image are ring shapes corresponding to the spiral waves of ±3 degrees. In other words, as in of FIG. 7a, in a case where the grating outer shape is a circle, it is seen that the ring-shaped diffraction spot is obtained. This is as illustrated in FIG. 3.

On the other hand, in a case where the outer shapes of the diffraction gratings are illustrated as in FIGS. 7a-7e, 7b the triangle (equilateral triangle) opening, 7c the rectangle (square) opening, 7d the pentagon (regular pentagon) opening, and 7e the star-shaped opening, the diffraction patterns become the shapes of the diffraction spots (99 and 97) as on the right side of FIGS. 7a-7e. In other words, as can be seen from FIGS. 7a-7e, the annular diffraction spots 97 have shapes that reflect the opening shapes. In addition, as the diffraction order is increased by reflecting the helicity, the size of each annular diffraction spot is increased. The respective annular diffractive spots on the diffraction image right side (the positive side) rotate by 90° in a clockwise direction, and the respective annular diffractive spots on the diffraction image left side (the negative side) rotate by 90° in a counterclockwise direction. The rotation by 90° is resulted from Fourier transform, and it is possible to measure the focus of the diffraction image from the characteristic shape utilizing the deviation degree of the rotation angle. This will it be described later in Example 9.

As mentioned in the description of FIGS. 6a-6e, it is possible to consider unusual results in a case where the diffraction grating is the edge dislocation grating as in FIGS. 7a-7e, and the result of a convolution of the diffraction grating and the opening shape. In other words, in a case where the edge dislocation is included in the grating plane, diffraction wave from the diffraction grating is not localized to a delta function, and is distributed in a ring-shape depending on the Bessel function (cylinder function) on the spatial frequency portion corresponding to the grating spacing of the diffraction grating.

Therefore, annular diffraction spots having a distribution that reflects the opening shape is obtained as a result of the product of the distribution with the spread of a Bessel function and the Fraunhofer diffraction pattern that reflects the opening shape. In other words, the use of the edge dislocation diffraction grating allows the diffraction spots with an opening shape, which are obtained only by using a special optical system in the related art, to be conveniently obtained even by using the optical apparatus or the particle beam apparatus of the related art.

The present application is intended to propose an optical apparatus or a particle beam apparatus, and a new diffraction method, in which the edge dislocation diffraction grating is used, the outer shape of the diffraction grating, that is, the opening shape of the diffraction grating has an arbitrary shape, and which enable processing by light beams or particle beams using the observation of the diffraction pattern of a new shape and using the shape.

EXAMPLE 1

Example 1 for implementing the present invention is illustrated in FIG. 8. It has a configuration different from that illustrated in FIG. 3, and a diffraction grating 91 including the edge dislocation is irradiated with a plane wave 23 passes through the diffraction grating and thereafter forms a spiral wave 21 as a diffraction wave. However, the opening shape 81 of the diffraction grating 91 including the edge dislocation has a shape as an arrowhead (hereinafter, referred to as an arrowhead shape), and as illustrated in FIGS. 7a-7e, the arrowhead shape is reflected in the shape of annular diffraction spots 97. Moreover, the shape is a diffraction pattern in which annular diffraction spots 97 are rotated (here, rotated by 90 degree) to the left and right of the orientation indicating the diffraction spot 99 of a transmitted wave is in clock/counter clockwise directions respectively.

It is possible to make a predetermined spiral wave 21 by spatially separating one of the annular (an arrowhead shape) diffraction spots on the diffractive surface. Conversely, it is possible to design the outer shape of the edge dislocation grating so as to fit the shape of a desired spiral wave. In this time, it is possible to control the degree of helicity according to the order of the edge dislocation and to control the positive and negative (right-handed and left-handed spirals) of the helicity depending on the positive and negative of the Burgers vector of the edge dislocation.

Next, the left diagram of FIG. 9A illustrates third-order edge dislocation diffraction grating of the opening shapes of regular pentagons of different sizes, and the right diagram illustrates the respective Fourier transform images thereof. Further, the left diagram of FIG. 9B illustrates electronic microscope images of the edge dislocation diffraction grating subjected to processing in the silicon nitride membrane (thickness 200 nm as an example) by the focusing ion beam apparatus, with reference to FIG. 9A, and small angle electron diffraction images obtained by irradiating the edge dislocation diffraction grating with electron beams of an acceleration voltage 300 kV. In addition, the right diagram is recorded at the camera length of 300 m.

Here, it can be seen that there is a correspondence between the calculation results of FIG. 9A and the experiment results of FIG. 9B. In other words, it can be seen that (1) the annular diffraction spot that reflects the opening shape of the regular pentagon is obtained, and (2) the size of the annular diffraction spot varies depending on the order of the diffraction spot (in other words, the degree of the helicity) and the size of the opening shape. In addition, it can be seen that (3) the orientations of the annular diffraction spots (positive and negative diffraction wave) are inverted in the left and right spots. Accordingly, since the annular diffraction spots that reflects the size and shape of the opening is obtained, it is possible to design the diffraction spots of an arbitrary shape based on these parameters.

Further, the left diagram of FIG. 10 illustrates edge dislocation diffraction gratings which are manufactured by rotating the orientation of the opening shape of the third-order edge dislocation grating having a square opening shape by 22.5 degree each at a time. The right diagram illustrates respective electron diffraction images thereof. The experimental condition is the same as in FIGS. 9A-9B. From FIG. 10, it can be seen that the left and right diffraction spots are both rotated in the same direction, in association with the azimuthal rotation of the opening shape. This property can be used in a focus measurement method of a diffraction image, and the like, which will be described later in Example 9.

EXAMPLE 2

Example 2 for implementing the present invention will be described with reference to FIG. 11A and FIG. 11B. FIG. 11A is an example of a diffraction grating system in which the diffraction grating 91 and the opener 83 are formed into a different structure. The opening shape 81 is a part of the opener 83. A state is illustrated in which the opener 83 is disposed adjacent to the upper part of the diffraction grating 91 (the grating outer shape is rectangular) with a third-order edge dislocation, but the upper and lower relationship between the diffraction grating and the opener, and the mutual distance are not limited to the configuration of FIGS. 11A and 11B. The relative positions of the diffraction grating and the opener may be changeable in the horizontal direction and the vertical direction. In other words, the positions of the diffraction grating 91 and the opener 83 may be changed.

FIG. 11B illustrates the shape without rotational symmetry (that is, having a single rotational symmetry) when the centroid point G of the opening shape made of a closed curve is an axis of symmetry. In FIG. 11B, a case where the centroid point G is coincident with the center of an arc at which the points H and I on the left side of the opening shape are present, but in this case, a relationship of HG=IG is established between the lengths of the line segment HG and the line segment IG. In general, the distance from a certain point on a closed curve to the centroid point is determined in one value, only in a case of an arc having the centroid point of the closed curve as the center thereof.

In FIG. 11B, the points M and N on the closed curve are two points on the same arc, but the centroid point G is not coincident with the central point of an arc at which the points M and N are present, such that a relationship of MG>NG is established between the lengths of the line segment MG and the line segment NG. Since the straight line is considered as an arc of which the distance to the center is infinite, the relationship between the points K and L is the same as that of the points M and N, and a relationship of KG≠LG is clearly established between the lengths of the line segment KG and the line segment LG.

In general, in a case where there are many distances from the centroid point of the shape enclosed by the closed curve to the closed curve, the shape has a single rotational symmetry. Only in special cases of a regular polygonal shape, the symmetry is high, and the shape may have two or more of finite number of rotational symmetry. For example, in FIGS. 7a-7e described above, FIG. 7b the triangle (equilateral triangle) opening→three rotational symmetries, FIG. 7c the rectangle (square) opening→four rotational symmetries, FIG. 7d the pentagon (regular pentagon) opening→five rotational symmetries, and FIG. 7e the star-shaped opening→five rotational symmetries. In addition, the arrowhead shape illustrated in FIG. 8 has a single rotational symmetry. In addition, FIG. 7a the circle opening→rotational symmetry.

As described above, even in a case the grating outer shape of the diffraction grating 91 is a rectangle as in the related art, it is possible to generate a spiral wave as described in Example 1 by being combined with the opener 83. With the present example, even in the diffraction grating 91 with high processing difficulty, it is possible to avoid a reduction in accuracy and an increase in a cost, that depend on the shape. In particular, it is possible to achieve a good effect, in a grating of a high order and a grating with a narrow grating spacing, due to the edge dislocation grating.

EXAMPLE 3

FIG. 12 illustrates Example 3 for implementing the present invention. FIG. 12 illustrates a case where a part of a closed curve defining the opening shape 81 of the opener 83 illustrated in FIG. 11 is irradiated with light beams or particle beams that irradiate a circular area. In the example of FIG. 12, the opening shape 81 of the light beams or the particle beams passing through the diffraction grating system becomes an irradiated area of the opening portion of the opener 83 as a result.

Accordingly, it is indicated that it is possible to realize the control equivalent to Example 2, not only by changing the shape of the opener 83, but also changing the irradiation area of the irradiation optical system and the irradiation intensity of the light beam or the particle beam (in other words, by deflecting the optical axis and converging beams by the lens).

EXAMPLE 4

FIG. 13 illustrates Example 4 for implementing the present invention. FIG. 13 is an example of a diffraction grating system in which the diffraction grating 91 including the edge dislocation and the opener 83 are formed into a different structure, and the opener 83 is disposed on an object plane through a lens 4 and the diffraction grating 91 is disposed on an image plane. Here, the object plane and the image plane are described separately, but they are equivalent planes in optics, and are not limited to the placement of this example. In other words, the placement of the diffraction grating 91 and the opener 83 may be replaced. Further, the optical system including the lens 4 may be an imaging optical system, and the number of lenses that exists between the diffraction grating 91 and the opener 83 is not particularly limited.

If the optical system is inserted between the diffraction grating and the opener as illustrated in FIG. 13, even if they are spatially separated, it is possible to make them adjacent effectively, and this is advantageous when a mechanical additional device is provided, such as providing a movement mechanism in the opener or the diffraction grating. That is, it is possible to increase the degree of freedom in design. Further, it is possible to utilize the effects of expansion or reduction possessed by the optical system. As an example, a diffraction grating of a large size is produced and is reduced and projected in the optical system, such that it is possible to performing a research such as improving the mechanical accuracy. As a different example, in the case of an optical system including plural lenses, it is possible to change the relative magnification while fixing the object plane and the image plane, thereby adjusting and changing the size of the opening at the time of use.

In addition, FIG. 13 illustrates an example in which the illumination optical system is adjusted so as to illuminate the entire opening portion of the opener with the light beam or the particle beam, differently from FIG. 12, but Example 4 is not inconsistent with Example 3, and Example 3 can be applied to this example. Incidentally, it should also be noted that other examples are compatible unless otherwise specified.

EXAMPLE 5

FIG. 14A and FIG. 14B illustrate Example 5 for implementing the present invention. FIG. 14A is an example of a diffraction grating system in which the diffraction grating 91, and an opener 1 (831), and an opener 2(832) are respectively disposed on an object plane and an image plane through the lens 4. However, the opener 1 (831) and the opener 2 (832) are configured with two or more structures, and at least one of the structures is disposed on the object plane of the optical system, and the other is disposed on the image plane of the optical system so as to be adjacent to the diffraction grating including the edge dislocation. Further, the positional relationship between the structures constituting the opener is determined by considering that the inversion of the image occurs caused by imaging.

Therefore, the same effect as in the diffraction grating having the opening shape illustrated in FIG. 14B is achieved as a result. Further, the positional relationship between the structures constituting the opener is changed depending on the optical system which is in use. In FIG. 14A, since a single imaging optical system with a single lens is assumed (the image is inverted before and after the lens relative to the optical axis), a first structure of the opener which is disposed on the object plane of the lens and a second structure which is disposed on the image plane of the lens are located on the left side of the drawing, but the placement is not limited thereto.

As illustrated in FIG. 14A, the advantage obtained by disposing the diffraction grating and the opener spatially and separately has been described in Example 4. In addition to the advantages of Example 4, since the opener is consisted with plural structures, not only the size of the opening, but also a part of the shape can be changed. This state is illustrated in FIGS. 15a-15e.

In FIG. 15a and of FIG. 15c, the structures constituting the opener are drawn on the same plane. The configuration on the image plane of FIG. 14 may be considered, and as illustrated in FIG. 15e, the opener configured with two adjacent structures (831) and (832) may be considered. FIG. 15b and of FIG. 15d illustrate how the size and shape of the opening are changed according to the change in a relative position between the two structures constituting the opener.

In addition, in the present example, two structures constituting the opener are exemplified, but the number is not limited to two. If the opening is configured with plural structures, plural and complex openers are configurable, in addition to the shape and size.

EXAMPLE 6

FIG. 16A illustrates Example 6 for implementing the present invention. FIG. 16A illustrates that openings 81 of plural shapes and sizes are provided in the opener 83 and the opener 83 is movable on a substantially vertical plane relative to the optical axis.

Even if plural openings 81 are provided in the opener configured with a single structure as in this example, the horizontal and vertical positional relationships between the diffraction grating and the opener which are described in the examples described above, the existence of a lens system between the diffraction grating and the opener can be realized at the same time, and the relationship of displacement of the diffraction grating and the opener as the configuration of the diffraction grating system is not limited to the example of FIG. 16A.

As in this example, it becomes possible to change conveniently (rapidly) the shape of the opening during the operation of the device, by using the opener having openings of plural shapes and sizes. In other words, it is possible to realize the improvement in the accuracy and efficiency (time reduction) of the experiment.

EXAMPLE 7

FIG. 16B illustrates Example 7 for implementing the present invention. FIG. 16B is an example of edge dislocation diffraction gratings (81) and (91) in which the diffraction grating 91 including the edge dislocation and the opening 81 are formed into an integral structure. The effect of the present example is that it is stable because whole is formed into an integral structure, and it is convenient also in operation such as alignment in the optical system. In the experiments illustrated in FIG. 4A, FIG. 4B, FIG. 9A, and FIG. 9B, this configuration is used.

EXAMPLE 8

FIG. 17 illustrates Example 8 for implementing the present invention. For convenience of explanation in this example, unless otherwise specified, although a description is made by exemplifying the electron beam, the present invention is not limited to the electron beam. FIG. 17 depicts a system configuration assuming an electronic microscope of a general purpose type having an acceleration voltage of about 300 kV, but the present invention is not limited to the electron microscope of this condition.

In the device (electronic microscope) described in this example, the diffraction grating 91 including the edge dislocation and the opener 83 are provided in the irradiation optical system below the acceleration tube 40, and the intensity and the size of the irradiation area of the electron beam 27 which irradiates the edge dislocation grating 91 are adjusted in the condenser lens 41 above the edge dislocation grating.

The relationship between the diffraction grating 91 and the opener 83 illustrated in FIG. 17 is close to the aspect described in Example 2 (FIG. 11A, or the like), but is not limited thereto, and is capable of corresponding to the aspects in all examples described hitherto in principle. In other words, for example, the opener 83 may also be located directly below, or below the diffraction grating 91 through the second condenser lens 42.

The generation of the spiral waves is confirmed by observing the ring-shaped or annular diffraction spots in the small angle diffraction image, by the electron beam transmitted through the edge dislocation grating. In addition, the helicity of the spiral wave that is given by the product of the order of the edge dislocation of the edge dislocation grating and the order of the diffraction spot can be estimated from the size of the ring-shaped or annular diffraction spots.

Whether the spiral wave irradiating the sample 3 is to be a convergence spiral wave (annular diffraction spot) or a plane wave-shape spiral wave can be selected in the second condenser lens 42 located between the edge dislocation diffraction grating 91 and the sample 3. Among electron beams transmitted through the edge dislocation grating 91, a predetermined electron spiral wave is selected by the diaphragm aperture element 15 above the sample 3, and is applied to the sample 3.

FIG. 17 illustrates a case where the sample 3 is irradiated with the first-order diffraction wave by the edge dislocation grating 91 as the convergence spiral wave. The observation of the sample or the process of the sample by the converging spiral waves may be performed by the device having this optical system.

With respect to the observation of the transmitted image of the sample, the electron beam transmitted through the sample 3 is expanded by an objective lens 5 and imaging lens systems (61, 62, 63, and 64) which are at the later stage than the sample, and is formed as an image on an image detection plane 89. A scanning observation method is reasonable when using a convergence spiral wave, but the observation method is not limited thereto. As will be described later in Example 13, in the case of using the same irradiation optical system by using plural edge dislocations gratings, spiral waves capable of radiating a wider area which enables transmission type observation as in the related art may be created. Meanwhile, an observation method is possible that does not require wide area irradiation such as high resolution observation. The formed sample image 35 is observed, for example, on the screen of the image data monitor 76, through a detector 79 and a controller 78, or stored in the recording unit 77 as image data.

These devices are formed into a system as a whole, and the operator checks a control state of the device on the screen of the monitor 52, and uses the system control computer 51 through the interface 53. In other words, the control unit can control the electron source 1, the acceleration tube 40, respective lenses (41, 42, 5, 61, 62, 63, and 64), the sample 3, the diffraction grating 91, the opener 83, the diaphragm aperture element 15, detector 79, and the like. Although the assumed electron beam apparatus is provided with an electron beam deflection system, a vacuum exhaust system, and the like, the illustration and description thereof will be omitted.

EXAMPLE 9

FIG. 18 illustrates Example 9 for implementing the present invention. FIG. 18 illustrates an optical system when observing the diffraction image 9. Basically, FIG. 18 is a schematic diagram of an electronic microscope of a general purpose type having the same configuration as in FIG. 17. Similar to FIG. 17, the electron microscope is not limited to the electron microscope having the configuration that is depicted in FIG. 18.

A system for measuring and adjusting focus of the diffraction image by using the present invention will be described. The diffraction image is directly observed at the rear side which is away by a sufficient propagation distance so as to satisfy the Fraunhofer diffraction condition represented in Equation (1) from the electron beam that is transmitted through or reflected by the sample. Further, in another method, the diffraction image is observed by the focal position of the objective lens rearward of the sample being formed on the observation surface in the lens system which is further rearward, by an electron microscope or the like.

This is a method assuming that the sample is irradiated with parallel electron beams, and with respect to actual observation of a diffraction image, if an optical system that observes an image of an electron source is constructed, it is possible to observe the diffraction image formed by electron beams transmitted through or reflected by the sample, regardless of the position of the sample. In other words, this is because the position of the light source in the optical system is away by an infinite distance to the sample regardless of an actual spatial distance, in other words, satisfies the Fraunhofer condition.

Meanwhile, in a case of observing the diffraction image formed by electron beams having information only from a predetermined area of the sample, it is necessary to strictly consider the positional relationship in the optical system, such as the use of a selected area diaphragm. For simplicity, in this example, a system for measuring and adjusting the focus of the diffraction image in the optical system will be described, assuming only the image of an electron source and an observing optical system.

In FIG. 18, the sample 3 is placed on the outside of the path 27 of the electron beam, and instead thereof, the edge dislocation grating 91 is positioned in the path. The outer shape of the edge dislocation grating 91 is adjusted by the opener 83 so as to be a predetermined shape, or as illustrated in FIG. 16B, becomes the edge dislocation gratings (81 and 91) having a predetermined opening shape.

In the optical system of the electron microscope of FIG. 18, it is adjusted into a diffraction image observation state, and the diffraction image 9 that reflects the outer shape of the edge dislocation grating is formed on the image detection plane 89. Then, spiral waves are formed, such that the diffraction spot has the shape 97 of the annular diffraction spot that reflects the outer shape of the edge dislocation grating, and as well as, the shape of the annular diffraction spot is subjected to azimuth rotation in the diffractive surface, with the propagation directions of the respective diffraction waves as axes, depending on the focus position of the diffraction image 9. In this rotation, this rotation depends on the defocus amount, and the rotation direction is reversed depending on the positive and negative of the diffraction wave. Further, the higher the spiral wave, the smaller the rotation angle.

FIG. 19 illustrates an experimental result. FIG. 19 is a diffraction image that is observed by changing the focus, by using the edge dislocation grating of a rhombus outer shape at the bottom of FIG. 10. As described above, it can be seen that the annular diffraction spots indicating rhombus spiral wave depending on the focus rotates in the diffraction surface. Moreover, while the diffraction spot of the transmission wave in the central part is changed in the size according to the defocus amount, the annular diffraction spot that reflects the outer shape rotates in the diffractive surface, but the size is hardly changed.

By using this phenomenon, it is possible to determine that the diffraction image is in-focus at a condition at which the rotation has reached a predetermined value (for example, a condition without rotation), only by detecting the rotation of the shape is detected, without greatly being affected from the shape and size of the annular diffraction spot. In other words, it is possible to determine the focus condition with high accuracy without requiring a skilled technique, when adjusting the focus of the optical system.

In the related art, the diffraction images is likely to be determined empirically, with the condition at which each diffraction spot appears in a smallest size and sharply as in-focus. Even in FIG. 19, the diffraction spot of the transmitted wave in the central part becomes the smallest in-focus, and this technique itself is not wrong. However, the diffraction spot is easily over the detection limit of a detector, because waves such as electron beams are in a convergence state. Charges are in a saturation state in a receiver such as a CCD device and halation occurs, such that artifact enters the intensity distribution. Therefore, it is difficult to determine the condition at which exact diffraction spots appear in the smallest size sharply.

In the method according to the present invention of obtaining from the shape of the diffraction spot, the subject to be observed is an annular diffraction spot, and a saturation of the strength in the receiver hardly occurs. Further, as described above, since the focus dependence on the shape and size of the annular diffraction spot is small, a highly accurate focus determination is possible by noting the shape of the annular diffraction spot.

Further, since the shape of the annular diffraction spot is known in advance from the outer shape of the edge dislocation grating, a determination compared with the simulation results is possible. Further, although FIG. 19 is an annular diffraction spot with four rotational symmetries due to the rhombus outer shape, as the arrowhead shape of FIG. 8, if the shape with a single rotational symmetry (a shape without a rotational symmetry) is selected, even in the case of large focus modulation, it is possible to avoid erroneous determination due to overlap of the symmetry.

The diffraction image formed on the image detection plane 89 is observed on the screen of the image data monitor 76 through the detector 79 and the controller 78 and is stored in the recording device 77 as image data, and it is possible to determine the focus condition by comparing for example this image with the diffraction image which is observed and recorded under different focus condition on the screen of the image data monitor 76. Alternatively, the defocus amount may be determined, for example, through an image process such as obtaining the correlation coefficient with the Fourier-transformed image of the edge dislocation grating that is stored in advance in the system control computer 51. Then, it becomes possible to perform an operation to cause the diffraction image 9 to be in an in-focus state by performing feedback control on the second condenser lens 42 or the objective lens 5, by using the system control computer 51. Since the measurement of these defocus amounts are essentially determined by image processing, the system control computer 51 may be provided with the functions as described above, or a separate image processing system, not illustrated, may be used. In addition, it is possible to automate the series of operations of the present invention.

If the focus of the diffraction image is determined by the above-mentioned operation, the edge dislocation grating (81 and 91) and the sample 3 are replaced, and the in-focus diffraction image of the sample is obtained. As illustrated in FIG. 18, if the diaphragm aperture element is placed immediately below the sample, it is possible to obtain a diffraction image of only a predetermined area of the sample without changing the optical system. Various methods are possible as described above for a method of generating the diffraction image of the sample, and are compatible with the method for measuring and adjusting the focus of the diffraction image of the present invention.

EXAMPLE 10

A method of selecting the momentum of the spiral waves, especially, a device and a method of determining and selecting the momentum in a predetermined one direction will be described. FIG. 2B is an example of a ring-shaped diffraction spot with the most common circle opening. With FIG. 2A as an example, assuming a spiral wave rotating in a counterclockwise direction with the propagation from top to bottom, the momentum transmitted to the irradiated sample rotates in the counterclockwise direction as indicated by arrows in the drawing. In this case, the combined sum of the momentum in all directions in the diffractive surface 94 is zero.

Meanwhile, the diffraction spot 97 which is enlarged and illustrated in the lead portion on the right side in FIG. 20 is an example of the annular diffraction spot 97 of a rectangular shape obtained when using the edge dislocation gratings (83 and 91) of the rectangular opening. Because the momentum is transmitted along the diffraction spot shape, the momentum is transmitted to the irradiated sample 3 along the rectangle sides as indicated by arrows in FIG. 20, and rotates in the counterclockwise direction. Even in this case, the combined sum of the momentum in all directions in the diffractive surface 94 is zero.

As has been described heretofore, it is possible to reflect the opening shape to the shape of the diffraction spots, in the case of the edge dislocation grating. Actually, the Fourier transform images (simulation results) on the right side of FIG. 7 are examples of the annular diffraction spots that reflect various opening shapes. What is described in Example 10 is an apparatus and a method of irradiating a predetermined position of a sample with a momentum in a predetermined direction, by selecting light beams or particle beams constituting a part of the annular diffraction spot that reflects the opening shape.

FIG. 20 is a schematic diagram of an optical system in which a diaphragm aperture element 15 with an aperture 16 of a predetermined shape which selectively transmits a part of the annular diffraction spot of a rectangle shape is inserted between the edge dislocation gratings (83 and 91) with the rectangular opening and the irradiated sample 3. Only the electron beam 27 that makes a diffraction spot of a straight portion on the inner or outer side of the annular diffraction spot 97 that transmits the momentum in the counter-clockwise rotation of the rectangular shape that is made by the first-order diffraction wave, is propagated without being blocked by the diaphragm, and transmits a straight upward momentum to the sample 3. If particles that are movable on the samples or small parts are provided, the upward momentum is obtained.

The spatial distance between the sample and the diaphragm aperture element corresponds to the defocus amount in the diffraction image described in Example 9. Therefore, a diaphragm aperture shape for which the azimuth rotation of the annular diffraction spot is considered in advance may be used, or a diaphragm aperture of the size and shape in which the azimuth rotation of the annular diffraction spot does not have a problem may be used. In addition, if the sample is irradiated with only the electron beam 27 that makes a diffraction spot of a straight portion on the inner or outer side of the annular diffraction spot 97, the aforementioned effects is achieved. Thus, it is not necessarily required to have the apertures 16 having a predetermined shape for selectively transmitting a part of the annular diffraction spot of the rectangular shape.

EXAMPLE 11

FIG. 21 illustrates Example 11 for implementing the present invention. Similar to FIG. 20, FIG. 21 is a schematic diagram of an optical system in which a diaphragm aperture element 15 with an aperture 16 of a predetermined shape which selectively transmits a part of the annular diffraction spot 97 of a rectangle shape is inserted between the edge dislocation gratings with the rectangular opening (not illustrated) and the irradiated sample 3. In order to avoid complication of the drawing, the drawing is made while only the annular diffraction spots 97 that transmit a momentum to the first-order diffraction wave and the counterclockwise rotation of a rectangle shape that the first-order diffraction wave makes, with the downward direction on the paper surface as the propagation direction.

FIG. 21 is similar to FIG. 20 in that only the electron beam 27 that makes the diffraction spot of the straight portion is propagated without being blocked by the diaphragm 16 and linear momentum is transmitted to the sample 3, but FIG. 21 illustrates that a different portion of the annular diffraction spot 97 is selected by moving the diaphragm aperture element 15 and the sample 3 is irradiated with the diffraction waves (the spiral waves 21) having a momentum with different directions as a result. If the diaphragm aperture element 15 is moved alternately to the left and right in the FIG. 21, the sample 3 can be irradiated with electron beams with straight downward (the left side of the annular diffraction spot) and straight upward (the right side of the annular diffraction spot) momentum alternately.

While FIG. 21 illustrates an example of transmitting momentum alternately in two up and down directions, if the moving direction and the order of the diaphragm aperture element are changed, the respective parts corresponding to electron beams forming the annular diffraction spots propagate in this order, and the momentum of the corresponding direction is transmitted to the irradiated sample in the corresponding order. If the opening shape of the edge dislocation grating is changed, selective irradiation corresponding to the opening shape is possible, and complex transmission of momentum is possible.

EXAMPLE 12

FIG. 22 illustrates Example 12 for implementing the present invention. Similar to FIG. 21, in FIG. 22, a part of a space from the edge dislocation grating (not illustrated) of the rectangular opening to the sample 3 is drawn, but the deflector 85 is provided above the diaphragm aperture element 15. For the convenience of the drawing, the deflector 85 of a parallel plate electrode type which is deflectable only in the left and right directions in the drawings is drawn in FIG. 22, but the present application is not limited to the aspect of FIG. 22 with respect to the deflection direction, the deflection method, and the shape of the deflector.

Differently from FIG. 21, in FIG. 22, a predetermined portion of the annular diffraction spot 97 is included in the diaphragm aperture 16 by applying deflection to the propagating diffraction wave 27 by using the deflector 85, instead of moving the diaphragm aperture element 15. Further, the linear momentum is transmitted to the sample 3 by irradiating the sample 3 which is disposed below. In a case where the spatial distance between the diaphragm aperture element 15 and the irradiated sample 3 is close, regardless of the angle and the orientation of deflection, it is possible to irradiate the same area on the sample 3 with the spiral wave 21 having a different momentum. For example, as illustrated in FIG. 22, if the sample is irradiated with spiral waves having a momentum of which orientation changes by 180 degrees alternately, it is possible to give an energy of a piston motion to the moving portion of a micro-machine (MEMS).

EXAMPLE 13

FIG. 23A illustrates patterns due to plural spiral waves generated by using a diffraction grating system including plural edge dislocation gratings. Both are the Fourier transform images obtained by simulation. In FIG. 23A, edge dislocation diffraction gratings (81 and 91) respectively having the opening shapes of a square, a circle, and an equilateral triangle in order of a size are illustrated on the left side, and the simulation results of the Fourier-transformed images thereof are illustrated on the right side. In other words, an example of a diffraction grating system is illustrated in which both the opening shapes 81 and the sizes of plural edge dislocation diffraction gratings 91 are changed. However, the basic grating spacings and orientations which characterize the diffraction grating, and the orders (three-order) of the edge dislocations included in the diffraction grating are respectively the same. Since plural spiral waves generated by diffraction have the same basic grating spacings and orientations, the spiral waves are superposed to match the diffraction spots. Therefore, the diffraction spots 97 are wide by being superposed, rather than narrow ring-shaped or annular on the diffractive surface. If the types of the diffraction gratings constituting the diffraction grating system are increased, it is possible to obtain a spiral wave suitable for an irradiation probe of a device of a general transmission-type rather than a scanning type. This is also referred to as a spiral wave suitable for the probe which is able to irradiate the area with a certain width on the sample at a time.

The left side of FIG. 23B illustrates an example of a diffraction grating system (81 and 91) in which the shape and the size of the opening of the edge dislocation diffraction grating and the order of the edge dislocation are the same but the distance and orientation of the basic diffraction grating are varied. The right side illustrates the simulation results of the Fourier transform images. As is apparent from the simulation, each edge dislocation diffraction grating 91 having a circle opening produces ring-shaped diffraction spots 97 centered on the diffraction point which corresponds to each grating spacing and orientation in the diffractive surface. It is possible to draw a pattern in the diffractive surface, as a result of that five ring-shaped diffraction spots 97 are superposed at different positions.

FIG. 23B is an example depicting a pattern of five wheels. Incidentally, for easy understanding of the correspondence between the edge dislocation diffraction grating 91 and the ring-shaped diffraction spots 97, the edge dislocation diffraction grating 91 on the left side is also located in the position similar to the pattern of a diffractive surface to be generated, but basically the left side and the right side of the drawing have the relationship of the real space and the reciprocal space, and the pattern on the diffractive surface does not depend on the positions of displacement of each diffraction grating. Thus, it is possible to draw a complicated graphic through superposition.

EXAMPLE 14

FIGS. 24a-24d illustrate a method of selecting and extracting a spiral wave illuminating a sample, by using a diffraction grating system including plural edge dislocation diffraction gratings, in order to transmit momentum having a predetermined direction and intensity to the sample, through the spiral wave.

The left side of of FIG. 24a is an example of a diffraction grating system (81 and 91) which is designed such that portions of annular diffraction spots 97, at which momentum match, overlap in the diffractive surface, by adjusting the orientation of the basic grating of the diffraction grating of a rectangular opening shape including edge dislocations of which the positive and the negative of the orders are different. Fourier-transformed images obtained by simulation are illustrated on the right side of FIG. 24a. In addition, as can be seen in of FIG. 24b, since the upper and lower annular diffraction spots 97 are formed while partially overlapping each other, a diffraction pattern as the drawing of the figure "8" is obtained. Since the respective annular diffraction spots 97 overlap such that the directions of the momentum of the spiral waves corresponding thereto match in the central part of the pattern of the figure "8", the increased intensity of the spiral wave is obtained. In this manner, it is possible to control the intensity by the superposition of diffraction spots.

Although two types of Fourier-transformed images are illustrated on the right side of FIG. 24a, the upper part corresponds to the diffraction image in the case where two edge dislocation diffraction gratings are irradiated with coherent waves (for example, a laser beam, a field emission electron beam, or the like), and the lower part corresponds to the diffraction image in the case where each diffraction image is obtained by irradiating each grating plane with coherent waves, but the diffraction wave from the upper and lower edge dislocation diffraction gratings are superposed incoherently.

This incoherent superposition corresponds to the case where, for example, the distance between the two edge dislocation gratings is away greater than the coherent distance of the wave to be irradiated. Comparing the upper and lower Fourier transform images, in the case of a coherent superposition (the upper part), the central portion, at which the upper and lower annular diffraction spots overlap, has a thin good linear intensity distribution from the result of the interference. On the other hand, in the case of incoherent superposition (lower part), there is only superposition of two upper and lower annular spots.

In the case of a diffraction grating system using plural diffraction gratings, it is necessary to consider the interference of the diffraction waves which are produced by the respective diffraction gratings. In the example of the right upper diffraction image of FIG. 24a, the upper and lower diffraction waves constructively interfere, but this is because the phases of the basic gratings of the respective diffraction gratings are coincident; and in a case where the phases of the basic gratings are deviated, contrary to the present example, a case of destructive interference result is considered. It is necessary to fully consider the diffraction grating system at a design time.

The left side of FIG. 24c is the diffraction grating system (81 and 91) including diffraction gratings with three rectangular openings having different orders of the edge dislocations and different grating spacings of the basic grating. The diffraction grating system is designed such that portions of annular diffraction spots 97, at which momentum exactly match, overlap in the diffractive surface. Although the Fourier-transformed images obtained by simulation are illustrated on the right side of FIG. 24a, a diffraction pattern is obtained in which a part of the annular diffraction spots 97 of a rectangular shape overlap to be inscribed. Since the parts with which the annular diffraction spots are in contact overlap such that the directions of the momentums of the spiral waves corresponding to respective annular diffraction spots coincide, the spiral waves are obtained of which the strength is increased (see FIG. 24d). Although the matching area is dependent on the graphic on the inner side, there is an effect of achieving a compact irradiation area as compared to FIG. 24b.

As described above, it is possible to draw various patterns on a diffractive surface by using spiral waves, by controlling conditions of the diffraction grating including edge dislocation:

(1) The positive and negative and the order of the edge dislocation (2) The grating spacing and orientation of basic diffraction grating (3) The opening shape and size of the edge dislocation diffraction grating (4) The number of edge dislocation diffraction gratings. It becomes possible to transmit a momentum of a certain direction and intensity to an irradiated sample, by selecting a predetermined portion of spiral waves constituting the pattern, and irradiating the sample with the selected portion.

Finally, it should be mentioned that there may be objections against discussing an optical system for neutron beams. There has been an attempt to develop effective lens for neutron beams and make an imaging optical system in the past. Therefore, in the present invention, it is considered in principle that the same treatment as for other charged particle beams is possible.

REFERENCE SIGNS LIST

1 ELECTRON SOURCE
15 DIAPHRAGM APERTURE ELEMENT
16 DIAPHRAGM APERTURE
17 DIAPHRAGM CONTROL SYSTEM
18 VACUUM VESSEL
19 ELECTRON SOURCE CONTROL SYSTEM
2 OPTICAL AXIS
21 SPIRAL WAVE
22 AXIS OF SPIRAL WAVE
23 PLANE WAVE
27 PARTICLE BEAM FLOW LINE AND ELECTRON BEAM TRACK
3 SAMPLE
35 SAMPLE IMAGE
39 SAMPLE STORAGE DEVICE CONTROL SYSTEM
4 LENS
40 ACCELERATION TUBE
41 FIRST CONDENSER LENS
42 SECOND CONDENSER LENS
47 SECOND CONDENSER LENS CONTROL SYSTEM
48 FIRST CONDENSER LENS CONTROL SYSTEM
49 ACCELERATION TUBE CONTROL SYSTEM
5 OBJECTIVE LENS
51 SYSTEM CONTROL COMPUTER
52 MONITOR OF SYSTEM CONTROL COMPUTER
53 INTERFACE OF SYSTEM CONTROL COMPUTER
59 OBJECTIVE LENS CONTROL SYSTEM
61 FIRST INTERMEDIATE LENS
62 SECOND INTERMEDIATE LENS
63 FIRST PROJECTION LENS
64 SECOND PROJECTION LENS
66 SECOND PROJECTION LENS CONTROL SYSTEM
67 FIRST PROJECTION LENS CONTROL SYSTEM
68 SECOND INTERMEDIATE LENS CONTROL SYSTEM
69 FIRST INTERMEDIATE LENS CONTROL SYSTEM
76 IMAGE DATA MONITOR
77 IMAGE DATA RECORDING DEVICE
78 IMAGE DATA CONTROLLER
79 IMAGE DETECTOR
81 OPENING
83 OPENER
831 COMPONENT OF OPENER
832 REMAINING COMPONENT OF OPENER
85 DEFLECTOR
88 OPENER CONTROL SYSTEM
89 IMAGE DETECTION PLANE
9 DIFFRACTION IMAGE
91 DIFFRACTION GRATING OR EDGE DISLOCATION DIFFRACTION GRATING
93 OPENER
94 DIFFRACTIVE SURFACE
96 DIFFRACTION GRATING CONTROL SYSTEM
97 ANNULAR SPOT OF DIFFRACTION WAVE
99 DIFFRACTION SPOT OF TRANSMITTED WAVE

The invention claimed is:
1. A charged particle beam apparatus comprising:
a diffraction grating including a third-order edge dislocation on a grating plane and having a non-circular, closed outer shape constructed to output a plurality of diffraction spots of a diffraction image, each of said plurality of diffraction spots having a same shape as said non-circular, closed outer shape of said diffraction grating; and a control unit that irradiates the diffraction grating with charged particle beams, wherein the control unit irradiates the grating plane with only a portion of an irradiation area of the charged particle beam according to the non-circular, closed outer shape, and wherein the portion of the irradiation area of the charged particle beam includes the edge dislocation of the diffraction grating.

2. The charged particle beam apparatus according to claim 1, wherein the control unit controls an irradiation portion of the charged particle beam so as to give momentum in a predetermined direction to an irradiated object, or controls an irradiation intensity of the charged particle beam so as to give momentum of a predetermined magnitude to the irradiated object.

3. The charged particle beam apparatus according to claim 2, wherein the control unit executes control of the irradiation portion or the irradiation intensity in a predetermined order.

4. The charged particle beam apparatus according to claim 1, wherein the control unit measures a state of focus, based on the shape of a detected diffraction image.

5. An optical apparatus, wherein, in the charged particle beam apparatus according to claim 1, light beams or particle beams are used instead of the charged particle beam.

6. An irradiation method comprising:

an irradiation step of irradiating a diffraction grating including a third-order edge dislocation on a grating plane with charged particle beams; and a detection step of detecting the charged particle beam passing through the diffraction grating, wherein the diffraction grating has a non-circular, closed outer shape constructed to output a plurality of diffraction spots of a diffraction image, each of said plurality of diffraction spots having a same shape as said non-circular, closed outer shape of said diffraction grating, wherein the irradiation step is a step of irradiating the grating plane with only a portion of an irradiation area of the charged particle beam, and wherein the portion of the irradiation area of the charged particle beam includes an edge dislocation of the diffraction grating.

7. The irradiation method according to claim 6, wherein the irradiation step is a step of controlling an irradiation portion of the charged particle beam so as to give momentum in a predetermined direction to an irradiated object, or controlling an irradiation intensity of the charged particle beam so as to give momentum of a predetermined magnitude to the irradiated object.

8. The irradiation method according to claim 7, wherein the irradiation step is a step of executing control of the irradiation portion or the irradiation intensity in a predetermined order.

9. The irradiation method according to claim 6, further comprising:

a measuring step of measuring a state of focus, based on the shape of a detected diffraction image.

10. The irradiation method according to claim 6, wherein light beams or particle beams are used, instead of the charged particle beam.

* * * * *